(12) United States Patent
Koyama et al.

(10) Patent No.: US 8,552,933 B2
(45) Date of Patent: Oct. 8, 2013

(54) LIGHT EMITTING DEVICE AND DRIVING METHOD OF THE SAME

(75) Inventors: Jun Koyama, Kanagawa (JP); Mitsuaki Osame, Kanagawa (JP); Yu Yamazaki, Tokyo (JP); Aya Anzai, Kanagawa (JP); Ryota Fukumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1456 days.

(21) Appl. No.: 10/876,714

(22) Filed: Jun. 28, 2004

(65) Prior Publication Data

US 2004/0263506 A1      Dec. 30, 2004

(30) Foreign Application Priority Data

Jun. 30, 2003   (JP) .................................. 2003-188746

(51) Int. Cl.
   *G09G 3/30*         (2006.01)
(52) U.S. Cl.
   USPC ............................................................ 345/76
(58) Field of Classification Search
   USPC ................. 345/76–82, 92, 204, 211
   See application file for complete search history.

(56) References Cited

U.S. PATENT DOCUMENTS

| | | | |
|---|---|---|---|
| 5,814,834 A | 9/1998 | Yamazaki et al. | |
| 6,207,969 B1 | 3/2001 | Yamazaki | |
| 6,229,508 B1* | 5/2001 | Kane ................................ | 345/82 |
| 6,246,384 B1 | 6/2001 | Sano | |
| 6,429,702 B2* | 8/2002 | Shulman ....................... | 327/111 |
| 6,555,968 B2* | 4/2003 | Yamazaki et al. ......... | 315/169.3 |
| 6,583,576 B2* | 6/2003 | Koyama ...................... | 315/169.2 |
| 6,583,775 B1 | 6/2003 | Sekiya et al. | |
| 6,661,180 B2 | 12/2003 | Koyama | |
| 6,730,966 B2 | 5/2004 | Koyama | |
| 6,753,654 B2 | 6/2004 | Koyama | |

(Continued)

FOREIGN PATENT DOCUMENTS

| | | |
|---|---|---|
| EP | 1107220 A2 | 6/2001 |
| JP | 9162414 A | 6/1997 |

(Continued)

OTHER PUBLICATIONS

Mayumi Mizukami et al.; "6-Bit Digital VGA OLED"; *SID 00 Digest*; pp. 912-915; 2000.

(Continued)

*Primary Examiner* — Dennis Joseph
(74) *Attorney, Agent, or Firm* — Fish & Richardson P.C.

(57) ABSTRACT

The invention provides a light emitting device and an element substrate in which a luminance variation of light emitting elements among pixels due to variation in characteristics of driving transistors can be suppressed even without suppressing the off-current of a switching transistor low or increasing the capacitance of a capacitor. A gate of a first transistor is connected to a first scan line, and a gate of a second transistor is connected to a second scan line. A connection between a signal line and a gate of a third transistor is controlled by the first transistor. The second transistor and the third transistor are connected in series between a pixel electrode of a light emitting element and a power supply line. The signal line, the second scan line and the power supply line are disposed in parallel, while the first scan line is crossed with the signal line, the second scan line and the power supply line.

10 Claims, 19 Drawing Sheets

(56) References Cited

U.S. PATENT DOCUMENTS

| | | | |
|---|---|---|---|
| 6,798,148 B2 | 9/2004 | Inukai | |
| 6,806,857 B2 | 10/2004 | Sempel et al. | |
| 6,809,482 B2 | 10/2004 | Koyama | |
| 6,909,240 B2 | 6/2005 | Osame et al. | |
| 6,982,462 B2 | 1/2006 | Koyama | |
| 7,061,451 B2 | 6/2006 | Kimura | |
| 7,122,969 B2 | 10/2006 | Fukumoto et al. | |
| 7,138,967 B2 | 11/2006 | Kimura | |
| 7,141,934 B2 | 11/2006 | Osame et al. | |
| 7,173,586 B2 | 2/2007 | Osame et al. | |
| 7,187,350 B2 | 3/2007 | Yoshida | |
| 7,247,995 B2 | 7/2007 | Osame et al. | |
| 7,250,720 B2 | 7/2007 | Sakakura et al. | |
| 7,271,785 B2 | 9/2007 | Jang | |
| 7,358,942 B2 | 4/2008 | Yamazaki et al. | |
| 7,525,119 B2 | 4/2009 | Koyama | |
| 7,714,818 B2 | 5/2010 | Osame et al. | |
| 2001/0002703 A1* | 6/2001 | Koyama | 257/40 |
| 2001/0024186 A1* | 9/2001 | Kane et al. | 345/98 |
| 2002/0000576 A1* | 1/2002 | Inukai | 257/202 |
| 2002/0011796 A1* | 1/2002 | Koyama | 315/169.1 |
| 2002/0039047 A1* | 4/2002 | Suzuki | 330/133 |
| 2002/0043997 A1* | 4/2002 | Stark et al. | 327/170 |
| 2002/0044140 A1* | 4/2002 | Inukai | 345/204 |
| 2002/0044208 A1* | 4/2002 | Yamazaki et al. | 348/272 |
| 2002/0101394 A1 | 8/2002 | Anzai | |
| 2002/0196212 A1 | 12/2002 | Nishitoba et al. | |
| 2003/0058687 A1 | 3/2003 | Kimura | |
| 2003/0062845 A1* | 4/2003 | Yamazaki et al. | 315/169.3 |
| 2003/0067424 A1 | 4/2003 | Akimoto et al. | |
| 2003/0103022 A1 | 6/2003 | Noguchi et al. | |
| 2003/0117352 A1* | 6/2003 | Kimura | 345/87 |
| 2003/0214247 A1* | 11/2003 | Yamazaki et al. | 315/169.3 |
| 2004/0080474 A1 | 4/2004 | Kimura | |
| 2004/0189214 A1 | 9/2004 | Osame et al. | |
| 2004/0207615 A1* | 10/2004 | Yumoto | 345/211 |
| 2004/0251953 A1 | 12/2004 | Yamazaki et al. | |
| 2004/0252565 A1 | 12/2004 | Yamazaki et al. | |
| 2004/0263066 A1 | 12/2004 | Abe et al. | |
| 2004/0263506 A1* | 12/2004 | Koyama et al. | 345/204 |
| 2005/0001830 A1 | 1/2005 | Osame et al. | |
| 2005/0012686 A1 | 1/2005 | Osame et al. | |
| 2007/0085796 A1 | 4/2007 | Osame et al. | |
| 2007/0132677 A1 | 6/2007 | Osame et al. | |
| 2009/0179549 A1 | 7/2009 | Abe et al. | |
| 2009/0218573 A1 | 9/2009 | Koyama | |

FOREIGN PATENT DOCUMENTS

| | | |
|---|---|---|
| JP | 2000-259098 A | 9/2000 |
| JP | 2001-042822 A | 2/2001 |
| JP | 2002149112 A | 5/2002 |
| JP | 2002-278497 | 9/2002 |
| JP | 2002358031 A | 12/2002 |
| JP | 2003-058107 A | 2/2003 |
| JP | 2003-150105 A | 5/2003 |
| JP | 2003255896 A | 9/2003 |
| JP | 2003295793 A | 10/2003 |
| JP | 2003534574 A | 11/2003 |
| JP | 2004347626 A | 12/2004 |
| JP | 2005-507505 | 3/2005 |
| WO | WO0191095 A1 | 11/2001 |
| WO | 03/027997 | 4/2003 |
| WO | WO03027997 A1 | 4/2003 |
| WO | 03/037040 | 5/2003 |

OTHER PUBLICATIONS

Kazutaka Inukai et al.; "4.0-in. TFT-OLED Displays and a Novel Digital Driving Method"; *SID 00 Digest*; pp. 924-927; 2000.

* cited by examiner

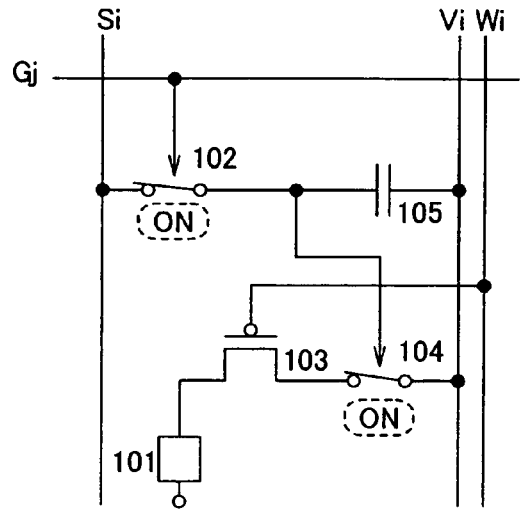
FIG. 2A WRITE PERIOD (ON)
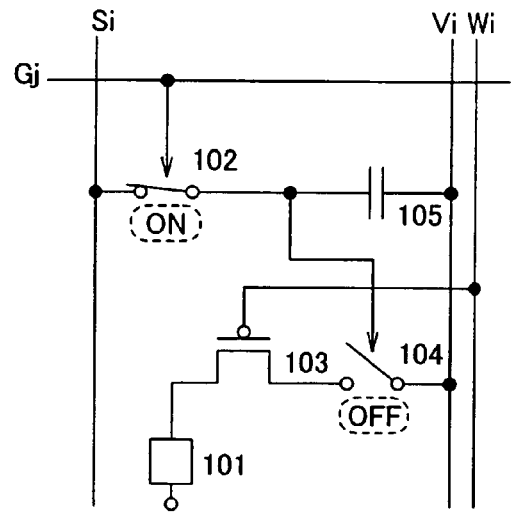
FIG. 2B WRITE PERIOD (OFF)
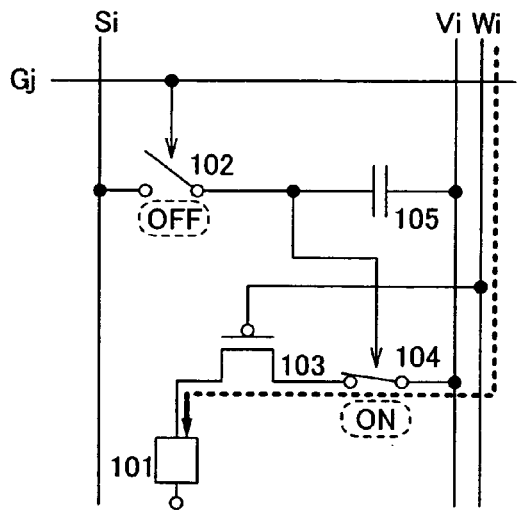
FIG. 2C STORE PERIOD (ON)
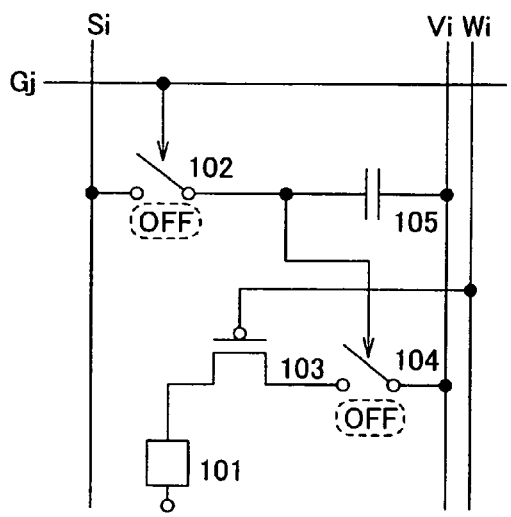
FIG. 2D STORE PERIOD (OFF)

LIGHT EMITTING DEVICE AND DRIVING METHOD OF THE SAME

BACKGROUND OF THE INVENTION

1. Field of the Invention

The present invention relates to a light emitting device in which a light emitting element and a unit for supplying current to the light emitting element are provided in each of a plurality of pixels.

2. Description of the Related Art

A light emitting element is highly visible since it emits light by itself A light emitting device formed by using the light emitting element does not require a backlight which is necessary in a liquid crystal display device (LCD) and it has no limit in its viewing angle. Therefore, the light emitting device formed by using the light emitting element is drawing attention as a display device which can substitute for a CRT and an LCD. In recent years, it is mounted in such electronic devices as a portable phone and a digital still camera, and its practical application is widely growing.

The light emitting device can be divided into two types: a passive matrix type and an active matrix type. The active matrix light emitting device which is becoming a mainstream is suitable for a large panel and high precision since current supply to a light emitting element can be maintained to some extent after inputting a video signal. A specific pixel configuration of the active matrix light emitting device varies according to manufacturers and each manufacturer exercises its ingenuity, however, at least the light emitting element, a transistor for controlling an input of a video signal to the pixel, and a transistor for supplying a current to the light emitting element are provided in each pixel.

SUMMARY OF THE INVENTION

These and other objects, features and advantages of the present invention will become more apparent upon reading of the following detailed description along with the accompanied drawings.

In the case where an off-current of the transistor for controlling an input of a video signal to the pixel is large, a gate-source voltage Vgs (hereinafter referred to as a gate voltage) of the transistor for controlling the amount of current to be supplied to the light emitting element tends to vary. In order to prevent the variation of the gate voltage Vgs, a capacitor having a larger capacitance may be provided between the gate and source of the transistor or the off-current of the transistor for controlling an input of a video signal to the pixel may be suppressed low. However, when the capacitor occupies a larger area, current may leak between the electrodes due to dust and the like, which leads to decrease the yield. Further, it takes cost and time to optimize the process of transistor so as to suppress the off-current of the transistor for controlling the input of the video signal to the pixel and also to increase the on-current for charging a large capacitance. It is also a problem that the gate voltage Vgs of the transistor for controlling the current supply to the light emitting element is apt to change easily in accordance with the switching of the other transistors, change in the potential of the signal line and scan line and the like due to the parasitic capacitance of the gate.

In view of the aforementioned problems, the invention provides a light emitting device in which the capacitor occupies a small area and the variation in luminance of the light emitting element caused by the variation in the gate voltage Vgs of the transistor for controlling the current supply to the light emitting element can be suppressed while using the transistors formed in the existing process.

According to the invention, not only a transistor (driving transistor) which determines a current value to be supplied to the light emitting element but a transistor (current controlling transistor) which operates as a switching element are also connected to a driving transistor in series. The driving transistor is turned ON by receiving a fixed potential to its gate at least in a period for displaying an image so that current can flow constantly. Further, the current controlling transistor operates in a linear region and its gate potential is controlled by the video signal inputted to the pixel.

When the current controlling transistor operates in a linear region, the source-drain voltage (drain voltage) Vds thereof becomes extremely small relatively to a voltage Vel applied to the light emitting element. Thus, a slight change in a gate voltage Vgs does not easily affect the current supplied to the light emitting element. The gate potential of the driving transistor is fixed without being controlled by a video signal. Therefore, the current supplied to the light emitting element does not change easily even without increasing the capacitance of the capacitor provided between the gate and source of the current controlling transistor, or suppressing the off-current of the transistor for controlling an input of a video signal to the pixel low. The current supplied to the light emitting element is not affected by the parasitic capacitance of the gate of the current controlling transistor. The current controlling transistor only operates to supply or not to supply a current to the light emitting element. The current value to be supplied to the light emitting element is determined by the driving transistor. Therefore, causes of the variation are decreased and the image quality can considerably be enhanced. Moreover, the process does not have to be optimized for suppressing the off-current of the transistor for controlling an input of a video signal to the pixel, therefore, fabrication process of the transistors can be simplified, which contributes to the reduction in cost and improvement in yield.

The driving transistor operates desirably in a saturation region in the invention, however, it may operate in a linear region as well. The drain current is apt to be affected by the slight change in the gate voltage Vgs in a saturation region more easily than in a linear region. However, the gate potential of the driving transistor is fixed in the invention, therefore, the gate voltage Vgs does not change even when the driving transistor operates in a saturation region. When the driving transistor operates in a saturation region, the drain current is not changed by the drain voltage Vds, but determined only by Vgs. Therefore, value of the drain current is maintained relatively constant even when Vds becomes small instead of Vel becoming large in accordance with the degradation of the light emitting element. Therefore, the reduction in luminance of the light emitting element and the appearance of the luminance variation due to the degradation of the electroluminescent material can be suppressed.

The channel length L of the driving transistor may be longer than the channel width W thereof, and L of the current controlling transistor may be equal to or shorter than W thereof. More desirably, L of the driving transistor may be 5 or more times as long as W. By employing the aforementioned structure, the variation in luminance of the light emitting element between the pixels due to the difference in characteristics of the driving transistor can be further suppressed. It is assumed that the channel length and the channel width of the driving transistor are L1 and W1 respectively, and the channel length and the channel width of the current controlling transistor are L2 and W2 respectively. Then, when L1/W1:L2/W2=X:1 is satisfied, X is desirably in the range of 5 to 6000. For example, there are cases that L1/W1=500 μm/3 μm, and L2/W2=3 μm/100 μm.

The light emitting element in this specification includes an element of which luminance is controlled by current or voltage, such as an OLED (Organic Light Emitting Diode), an MIM electron source element (electron emitting element) used to a FED (Field Emission Display) and the like.

The light emitting device includes a panel in which a light emitting element is sealed, and a module in which an IC and the like having a controller are mounted on the panel. The invention relates to an element substrate corresponding to one mode that is before completing the light emitting element in the process for fabricating the light emitting device. Each of the plurality of pixels on the element substrate is provided with a unit for supplying current to the light emitting element.

The element substrate may be in a various modes such as the one that only pixel electrode of the light emitting element is formed, or the one that after forming a conductive layer as the pixel electrode and before patterning to form the pixel electrode.

The OLED as a light emitting element includes a layer containing an electroluminescent material in which luminescence (electroluminescence) is generated by applying an electric field (hereinafter, referred to as an electroluminescent layer), an anode layer and a cathode layer. The electroluminescent layer is formed by a single or a plurality of layers and provided between the anode and the cathode. At least one of the aforementioned layers may include a non-organic compound. A light emission in returning to a base state from a singlet excitation state (fluorescence) and a light emission in returning to a base state from a triplet excitation state (phosphorescence) are included in the luminescence in the electroluminescent layer.

A thin film transistor formed by using polycrystalline silicon and amorphous silicon can be used as a transistor used in a light emitting device of the invention, however, it is not exclusively limited to the thin film transistor. It may be a transistor formed by using single crystalline silicon or by using SOI. Moreover, it may be a transistor formed by using an organic semiconductor or a transistor formed by using carbon nanotube. A transistor provided in a pixel of the light emitting device of the invention may have a single gate structure, a double-gate structure, or a multi-gate structure having a plurality of gate electrodes.

According to the invention, the current supplied to the light emitting element does not change easily even without increasing the capacitance of the capacitor provided between the gate and source of the current controlling transistor, or suppressing the off-current of the transistor for controlling an input of a video signal to the pixel low. The current supplied to the light emitting element is not affected by the parasitic capacitance of the gate of the current controlling transistor. The current controlling transistor only operates to supply or not to supply a current to the light emitting element. The current value to be supplied to the light emitting element is determined by the driving transistor. Therefore, causes of the variation are decreased and the image quality can considerably be enhanced. Moreover, the process does not have to be optimized for suppressing the off-current of the transistor for controlling an input of a video signal to the pixel, therefore, fabrication process of the transistors can be simplified, which contributes to the reduction in cost and improvement in yield.

The driving transistor operates desirably in a saturation region in the invention, however, it may operate in a linear region as well. The drain current is apt to be affected by the slight change in the gate voltage Vgs in a saturation region more easily than in a linear region. However, the gate potential of the driving transistor is fixed in the invention, therefore, the gate voltage Vgs does not change easily even when the driving transistor operates in a saturation region. When the driving transistor operates in a saturation region, the drain current is not changed by the drain voltage Vds, but determined only by Vgs. Therefore, value of the drain current is maintained relatively constant. Therefore, the reduction in luminance of the light emitting element and the appearance of the luminance variation due to the degradation of the electroluminescent material can be suppressed.

BRIEF DESCRIPTION OF THE DRAWINGS

FIGS. 2A to 2D are diagrams showing driving methods of the light emitting device shown in FIG. 1.

DETAILED DESCRIPTION OF THE INVENTION

[Embodiment Mode1]

Figure 1:
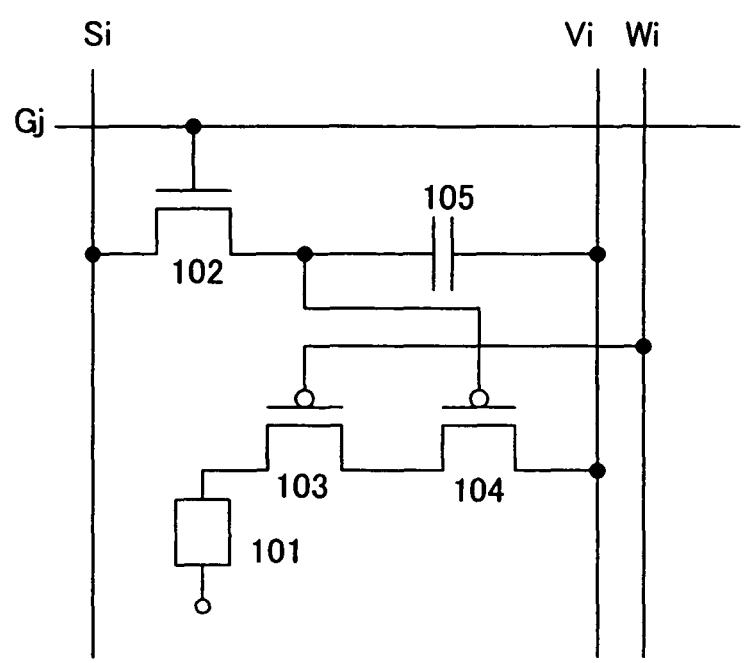
FIG. 1 is a circuit diagram of a pixel of the light emitting device of the invention.

FIG. 1 shows one mode of a pixel in the light emitting device of the invention. The pixel shown in FIG. 1 includes a light emitting element 101, a transistor (switching transistor) 102 for controlling an input of a video signal to the pixel, a driving transistor 103 for controlling a current value to be supplied to a light emitting element 101, and a current controlling transistor 104 which operates to supply or not to supply current to the light emitting element 101. A capacitor 105 may be provided in the pixel for maintaining the potential of the video signal as in this embodiment mode.

In FIG. 1, the driving transistor 103 and the current controlling transistor 104 may have the same polarity or different polarity. The driving transistor 103 operates in a saturation region as an example in this embodiment mode, however, it may operate in a linear region as well. The switching transistor 102 and the current controlling transistor 104 operate in a linear region. The driving transistor 103 may be an enhancement mode transistor or a depletion mode transistor. The switching transistor 102 may be either an n-type or p-type transistor.

The gate of the switching transistor 102 is connected to a scan line Gj (j=1 to y). One of the source and drain of the switching transistor 102 is connected to a signal line Si (i=1 to x) and the other is connected to the gate of the current controlling transistor 104. The gate of the driving transistor 103 is connected to a second power supply line Wi (i=1 to x). The driving transistor 103 and the current controlling transistor 104 are connected to a first power supply line Vi (i=1 to x) and the light emitting element 101 so that the current supplied from the first power supply line Vi (i=1 to x) is supplied to the light emitting element 101 as a drain current of the driving transistor 103 and the current controlling transistor 104. In this embodiment mode, the source of the current controlling transistor 104 is connected to the first power supply line Vi (i=1 to x) and the drain of the driving transistor 103 is connected to a pixel electrode of the light emitting element 101.

It should be noted that the source of the driving transistor 103 may be connected to the first power supply line Vi (i=1 to x) and the drain of the current controlling transistor 104 may be connected to the pixel electrode of the light emitting element 101.

The light emitting element 101 includes an anode, a cathode, and an electroluminescent layer formed between the anode and the cathode. One of the anode and the cathode is the pixel electrode and the other is a counter electrode.

One of two electrodes of the capacitor 105 is connected to the first power supply line Vi (i=1 to x) and the other is connected to the gate of the current controlling transistor 104. The capacitor 105 is provided in order to hold the gate voltage of the current controlling transistor 104. Note that the capacitor 105 is provided in FIG. 1, however, the invention is not exclusively limited to this configuration and the capacitor 105 may not necessarily be provided.

In the case of using p-type transistors as the driving transistor 103 and the current controlling transistor 104 as in FIG. 1, the drain of the driving transistor 103 and the anode of the light emitting element 101 are desirably connected to each other. That is to say, it is desirable to use the anode as the pixel electrode and the cathode as the counter electrode. In the case of using n-type transistors as the driving transistor 103 and the current controlling transistor 104, on the other hand, the source of the driving transistor 103 and the cathode of the light emitting element 101 are desirably connected to each other. That is to say, it is desirable to use the cathode as the pixel electrode and the anode as the counter electrode.

A driving method of the pixel shown in FIG. 1 is described now. The operation of the pixel shown in FIG. 1 can be described in two periods: a write period and a store period. FIG. 2A shows the operation when the current controlling transistor 104 is ON in the write period, and FIG. 2B shows the operation when the current controlling transistor 104 is OFF in the write period. FIG. 2C shows the operation when the current controlling transistor 104 is ON in the store period and FIG. 2D shows the operation when the current controlling transistor 104 is OFF in the store period. Note that the switching transistor 102 and the current controlling transistor 104 are shown simply as switches in FIGS. 2A to 2D in order to simplify the operations.

In the write period, current supply to the light emitting element 101 is stopped regardless of the switching of the current controlling transistor 104. Specifically, potential difference between the counter electrode of the light emitting element 101 and the first power supply line Vi (i=1 to x) may be zero. Otherwise, potential difference between the counter electrode and the first power supply line Vi (i=1 to x) may be controlled so that a reverse bias voltage is applied between a pair of electrodes of the light emitting element 101 when it is considered as a diode. Alternatively, current path to the light emitting element 101 may be blocked by a switch and the like. When a scan line Gj (j=1 to y) is selected, the switching transistor 102 of which gate is connected to the scan line Gj (j=1 to y) is turned ON. Then, a video signal inputted to the signal line Si (i=1 to x) is inputted to the gate of the current controlling transistor 104 through the switching transistor 102. The second power supply line Wi (i =1 to x) constantly applies a potential to the gate of the driving transistor 103 which is high enough to turn ON the driving transistor 103 when the current controlling transistor 104 is ON.

It should be noted that the current supply to the light emitting element 101 is stopped in the write period when the current controlling transistor 104 is ON as shown in FIG. 2A and when it is OFF as shown in FIG. 2B in accordance with the potential of a video signal. Therefore, all the light emitting elements 101 are in non-light emitting state in the write period. The potential video signal written in the write period is held by controlling the potential of the scan line Gj (j=1 to y) to turn OFF the switching transistor 102.

In the store period, potential difference which is high enough to supply a forward bias current to the light emitting element 101 is provided between the counter electrode of the light emitting element 101 and the first power supply line Vi (i =1 to x), therefore, current flows to the light emitting element 101 when the current controlling transistor 104 is ON.

Therefore, in the case where the current controlling transistor 104 is ON, current is supplied to the light emitting element 101 through the first power supply line Vi (i=1 to x) as shown in FIG. 2C. The current supplied to the light emitting element 101 is determined by the drain current of the driving transistor 103 and the V-I characteristics of the light emitting element 101. The light emitting element 101 emits light at a luminance according to the supplied current. On the other hand, in the case where the current controlling transistor 104 is turned OF in the write period as shown in FIG. 2D, current supply to the light emitting element 101 is stopped because the potential of the video signal is held in the capacitor 105. Therefore, the light emitting element 101 remains the non-light emitting state.

Figure 3A:
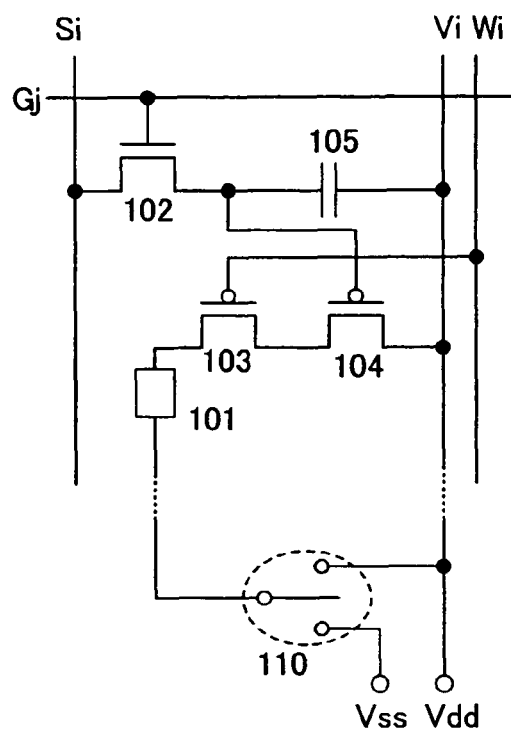
FIGS. 3A and 3B are diagrams showing driving methods of the light emitting device shown in FIG. 1.

FIG. 3A shows a configuration of a switch as an example in the case of stopping the current supply to the light emitting element 101 by making no potential difference between the counter electrode of the light emitting element 101 and the first power supply line Vi (i=1 to x) in the pixel shown in FIG. 1. By changing over a switch 110 as shown in FIG. 3A, a potential Vdd is applied to the first power supply line Vi (i=1 to x) and the counter electrode of the light emitting element 101 in the write period, and a potential Vss is applied to the counter electrode of the light emitting element 101 and a potential Vdd is applied to the first power supply line Vi (i=1 to x) in the store period so that a forward bias current can be supplied to the light emitting element 101.

Figure 3B:
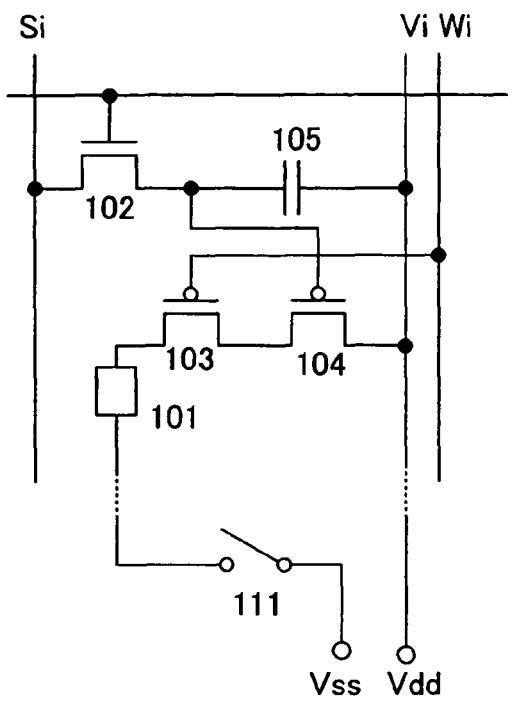

FIG. 3B shows a configuration of a switch in the case of stopping the current supply to the light emitting element 101 by blocking the current path to the light emitting element 101 in the pixel shown in FIG. 1. As shown in FIG. 3B, the counter electrode floats by blocking the current path to the light emitting element 101 by turning OFF the switch 111 in the write period, and current flows to the light emitting element 101 by turning ON the switch 111 in the store period so that a forward bias current can be supplied to the light emitting element 101.

Timing of the write period and the store period as an example is described with reference to FIG. 4.

Figure 4:
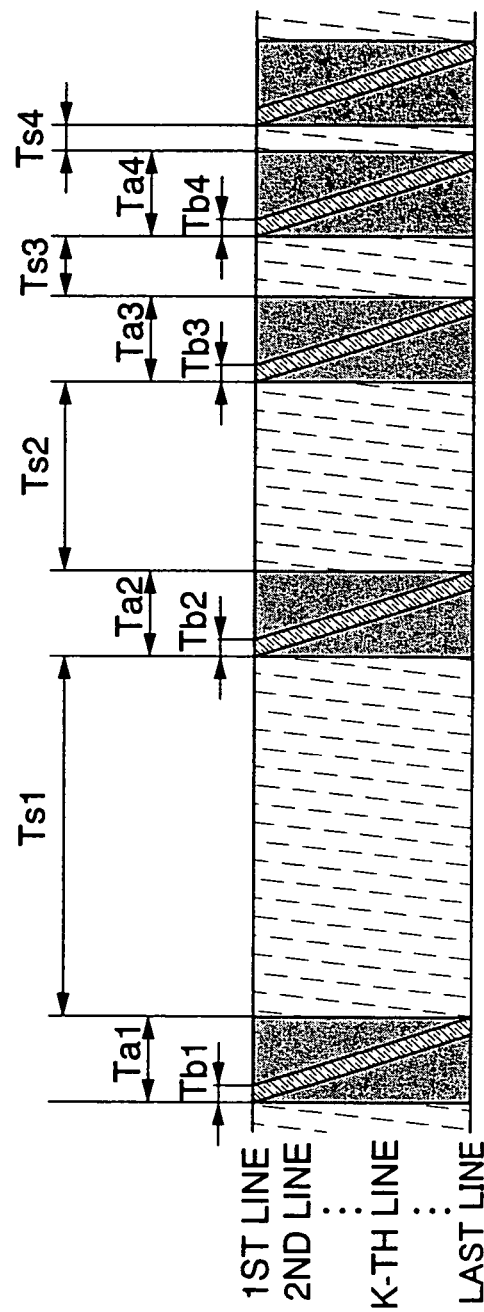
FIG. 4 is a diagram showing a timing of a write period and a store period of the light emitting device of the invention.

FIG. 4 shows an example of displaying a 4-bit gray scale by using time gray scale method. Ts1 to Ts4 are store periods corresponding to each bit. The length of the store periods are in the following ratio. Ts1:Ts2:Ts3:Ts4=$2^3:2^2:2^1:2^0$=8:4:2:1. Tb1 to Tb4 correspond to write periods per row of pixels aligned along the scan line corresponding to each bit. Ta1 to Ta4 correspond to the total write periods from the start of writing corresponding to each bit until finishing the writing of all lines of pixels.

In the write period Tb1, scan lines are selected from the pixels of the first row to turn ON the switching transistors. Subsequently, video signals are inputted to each pixel from the signal line. Once video signals are inputted, the write period Tb1 terminates in that row and the potential of the video signal is held. This operation is performed up to the last row and the period Ta1 terminates. Subsequently, the store period Ts1 starts in all rows. In the store period, light emission and non-light emission of each pixel are controlled by the potential of the video signal inputted in the write period Ta1. After the store periods terminate in all pixels all at once, the write period Tb2 corresponding to the next bit starts from the pixels of the first row again.

Description was made on the case of displaying a 4-bit gray scale, however, the number of bits and gray scale are not limited to this. Further, the order of the store periods does not have to be Ts1 to Ts4. It may be randomly ordered or each store period may be divided into a plurality of periods for performing display.

When the current controlling transistor 104 operates in a linear region, the drain voltage Vds thereof becomes extremely small relatively to a voltage Vel applied to the light emitting element 101. Thus, a slight change in a gate voltage Vgs does not easily affect the current supplied to the light emitting element 101. The gate potential of the driving transistor 103 is fixed without being controlled by video signal. Therefore, the current supplied to the light emitting element 101 does not change easily even without increasing the capacitance of the capacitor 105 provided between the gate and source of the current controlling transistor 104, or suppressing the off-current of the switching transistor 102 low. The current supplied to the light emitting element 101 is not affected by the parasitic capacitance of the gate of the current controlling transistor 104. The current controlling transistor 104 only operates to supply or not to supply a current to the light emitting element 101. The current value to be supplied to the light emitting element 101 is determined by the driving transistor 103. Therefore, causes of the variation are decreased and the image quality can considerably be enhanced. Moreover, the process does not have to be optimized for suppressing the off-current of the switching transistor 102, therefore, fabrication process of the transistors can be simplified, which contributes to the reduction in cost and improvement in yield.

The driving transistor 103 operates desirably in a saturation region, however, it may operate in a linear region as well. The drain current is apt to be affected by the slight change in the gate voltage Vgs in a saturation region more easily than in a linear region. However, the gate potential of the driving transistor 103 is fixed in the invention, therefore, the gate voltage Vgs does not change easily even when the driving transistor 103 operates in a saturation region. When the driving transistor 103 operates in a saturation region, the drain current is not changed by the drain voltage Vds, but determined only by Vgs. Therefore, value of the drain current is maintained relatively constant even when Vds gets small instead of Vel getting large in accordance with the degradation of the light emitting element. Therefore, the reduction in luminance of the light emitting element and the appearance of the luminance variation due to the degradation of the electroluminescent material can be suppressed.

Figure 5:
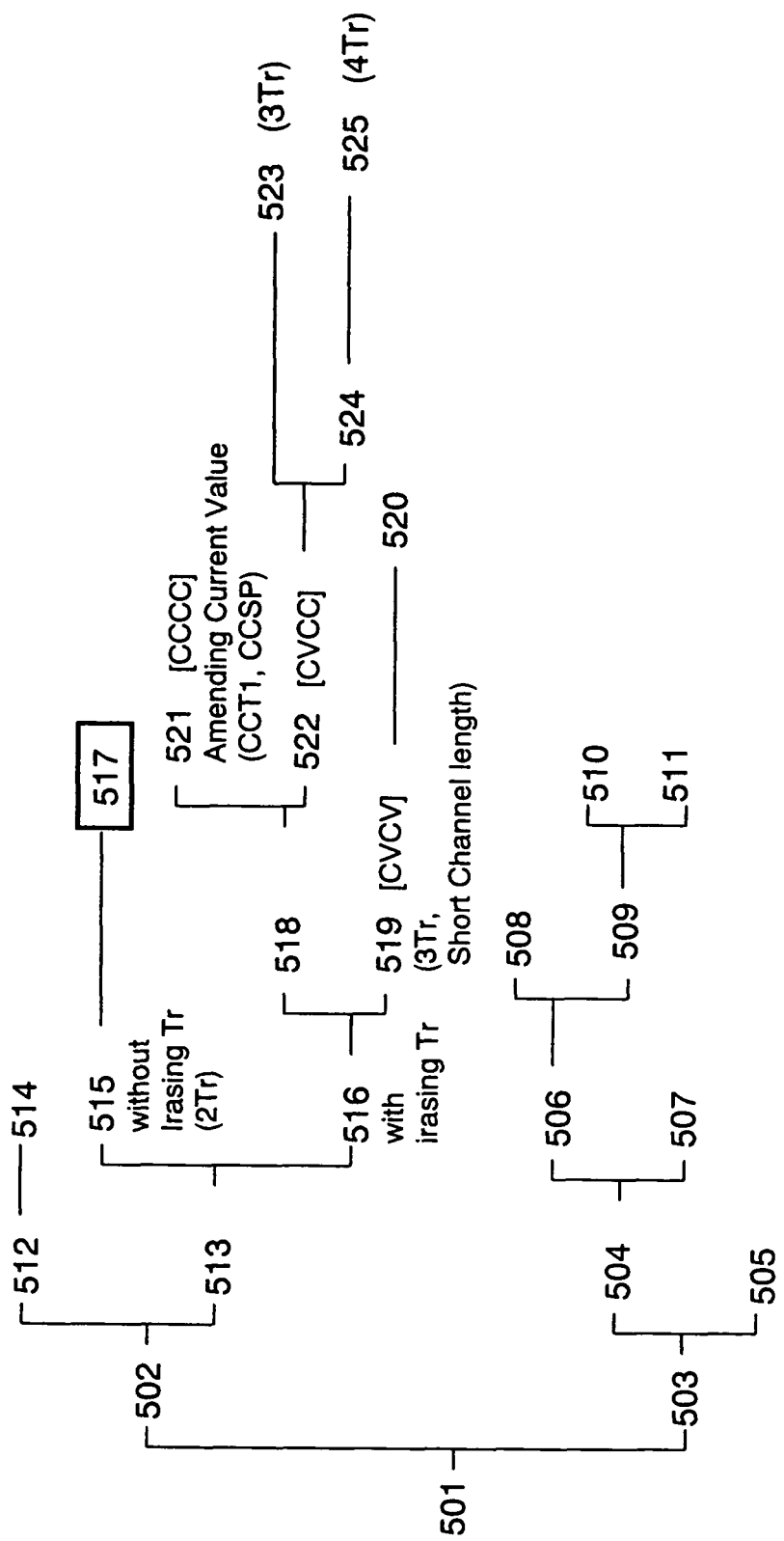
FIG. 5 is a diagram showing driving methods of an active matrix light emitting device.

In an active matrix light emitting device, current supply to the light emitting element can be maintained to some extent even after the video signal is inputted. Therefore, it can be flexibly applied to a large panel and high precision and it is becoming a mainstream in the future. A specific pixel configuration of the active matrix light emitting device varies according to manufacturers and each manufacturer exercises its ingenuity. FIG. 5 shows a systematic classification of the driving methods of the active matrix light emitting device.

As shown in FIG. 5, driving method of an active matrix light emitting device 501 is roughly classified into two: the one with digital video signals 502 and the one with analog digital signals 503. Furthermore, an analog light emitting device is classified into a current modulation type 504 in which the current value supplied to a light emitting element is modulated in an analog manner, and a time modulation type 505 in which the gray scale is displayed by changing the ON/OFF periods of an inverter. A light emitting device of the current modulation type can also be classified into the one having a Tr characteristic correction circuit 505, and the one having no Tr characteristic correction circuit 506. The Tr characteristic correction circuit is a circuit for correcting characteristic variation of driving transistors, such as a circuit for correcting only the threshold voltage or a circuit for correcting the current value (including the threshold voltage, the mobility, and all the other like).

The light emitting device having the Tr characteristic correction circuit which is classified as the current modulation type is further classified into the one in which the threshold voltage is corrected by a voltage programming 508 and the one in which the current value is corrected by a current programming 509. In the voltage programming, video signals are inputted with voltage, thereby correcting variation in the threshold voltage of a driving transistor. On the other hand, in the current programming, video signals are inputted with current, thereby correcting variation in the current value (including the threshold voltage, the mobility, and all the other like) of a driving transistor. Since a light emitting element is a current driving element and its luminance intensity is determined by a current value, current value may be directly used as data.

The light emitting device in which the current value is corrected by a current programming is further classified into a current mirror type 510 and non-current mirror type 511. In the light emitting device of the current mirror type, a transistor for setting current and a transistor for supplying current to a light emitting element are separately disposed in a pixel circuit using a current mirror circuit. It is an initial premise that the two transistors have the identical characteristics. In the light emitting device of the non-current mirror type, a current mirror circuit is not used and current setting and current supply to a light emitting element are controlled by using one transistor.

On the other hand, a digital light emitting device is classified into the one using an area gray scale method 512 and the one using a time gray scale method 513. According to the area gray scale method, each pixel includes sub-pixels whose light emission areas are sectioned by the square as 1:2:4:8: and . . ., then the gray scale is displayed by selecting them. The area gray scale method includes a gate potential fixation method during light emission 514. According to the gate potential fixation method during light emission, Vgs of the driving transistor is maintained constant by fixing the gate potential of the driving transistor during light emission period of the light emitting element to improve the display defect. The video signals are inputted to the gate of the current controlling transistor connected in series to the driving transistor.

According to the time gray scale method, one frame includes several sub-frames whose light emission period is sectioned by the square as 1:2:4:8: and . . . , then the gray scale is displayed by selecting them. The time gray scale method is also classified into a DPS (Display Period Separated) drive 515 and an SES (Simultaneous Erasing Scan) drive 516. According to the DPS drive, each sub-frame includes two periods: a data write period (Addressing Period) and a light emission period (Lighting Period). The DPS drive is disclosed in "M. Mizukami, et al., 6-Bit Digital VGA OLED, SID00 Digest, p.912". The DPS drive includes the gate potential fixation method during light emission which is described above 517. The invention is classified into the gate potential fixation method during light emission of DPS drive.

According to the SES drive, the data write period and the light emission period can be overlapped with each other by using an erasing transistor, thus a light emitting element can emit light for a longer period. The SES drive is disclosed in "K. Inukai, et al., 4.0-in. TFT-OLED Displays and a Novel Digital Driving Method, SID00 Digest, p.924". The SES drive is further classified into a constant current drive and a constant voltage drive. According to the constant current drive, a light emitting element is driven at a constant current, in which a current can be supplied constantly without being affected by the resistance change of a light emitting element. According to the constant voltage drive, a light emitting element is driven at a constant voltage. The constant voltage drive includes the gate potential fixation method during light emission which is described above 520.

The constant current drive light emitting device is classified into the one having a Tr characteristic correction circuit 521, and the one having no Tr characteristic correction circuit 522. As a light emitting device having the Tr characteristic correction circuit here is a light emitting device of a drive (CCT1) as disclosed in International publication WO 03/027997 and a light emitting device of a drive (CCSP) as disclosed in Japanese Patent Laid-Open No.2003-255896. The light emitting device having no Tr characteristic correction circuit is further classified into the one comprising a driving transistor with a long channel length and the one using a gate potential fixation method during light emission. The light emitting device using the gate potential fixation method during light emission may have a long channel length. The display device comprising a driving transistor with a long channel length is disclosed in Japanese Patent Laid-Open No. 2003-295793. According to the display device comprising a driving transistor with a long channel length, characteristic variation of driving transistors driven at a constant current drive are suppressed. When the gate length is designed extremely long, Vgs in the vicinity of the threshold voltage is not used, thus it becomes possible to reduce variation in current value supplied to the light emitting element in each pixel.

Figure 6:
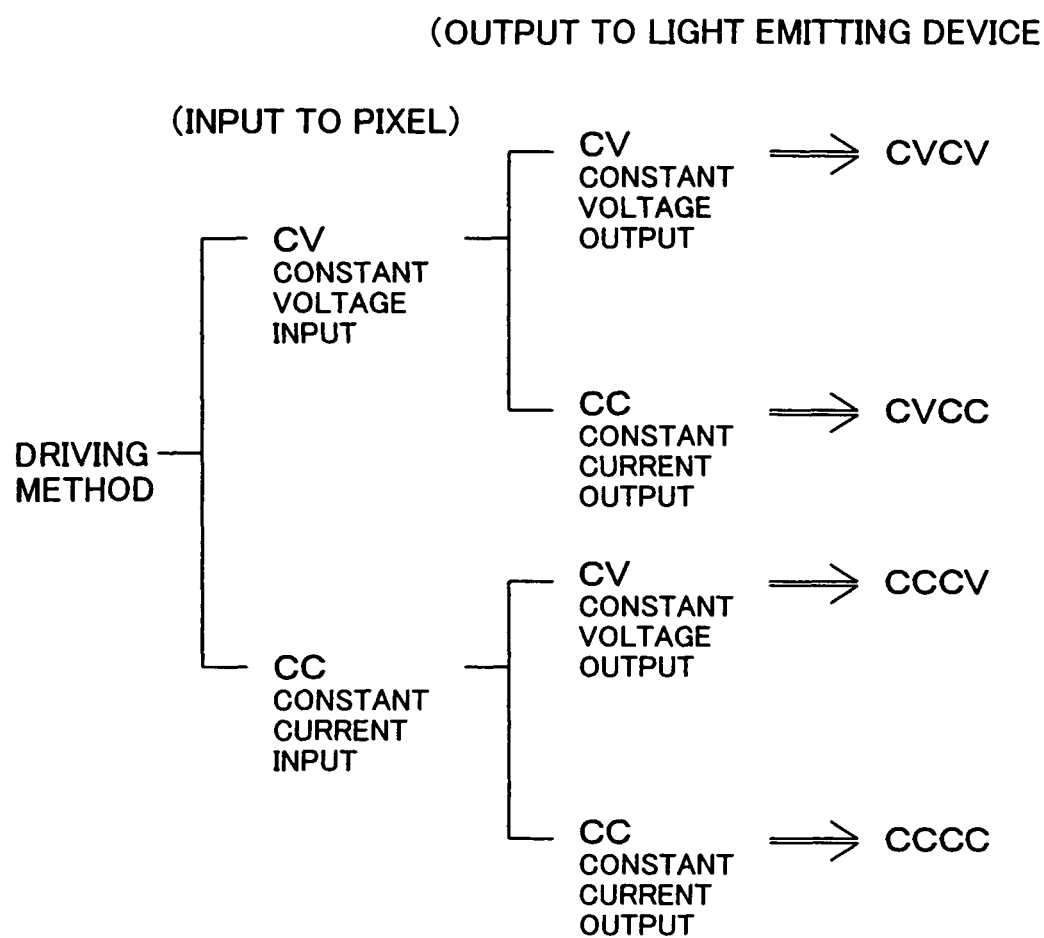
FIG. 6 is a list of driving methods classified by voltage or current of the video signals.

FIG. 6 shows a list of the driving methods classified by voltage or current of the video signals in the light emitting device with digital video signals. As shown in FIG. 6, there are the one in which video signals are inputted with constant voltage (CV) to the pixels and the one in which video signals are inputted with constant current (CC) when the light emitting element emits light.

The driving method in which video signals are inputted with constant voltage (CV) includes the one in which constant voltage is applied to the light emitting element (CVCV) and the one in which constant current is supplied to the light emitting element (CVCC). Further, the driving method in which video signals are inputted with constant current (CC) includes the one in which constant voltage is applied to the light emitting element (CCCV) and the one in which constant current is supplied to the light emitting element (CCCC).

The light emitting device of the invention is classified into CVCV when the driving transistor operates in a linear region, and CVCC when it operates in a saturation region.

[Embodiment Mode2]

In this embodiment mode, one mode of a pixel in the light emitting device of the invention which is different from Embodiment Mode 1 is described.

Figure 7A:
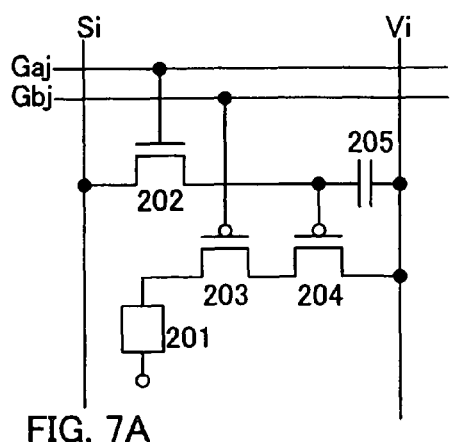
FIGS. 7A to 7E are circuit diagrams of a pixel of the light emitting device of the invention.
Figure 7B:
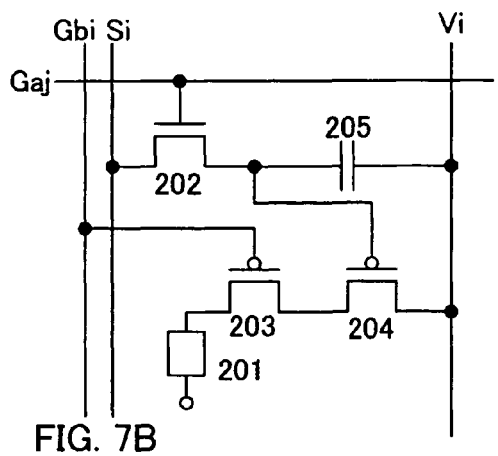

FIG. 7A shows a pixel configuration according to this embodiment mode. The pixel shown in FIG. 7A includes a light emitting element 201, a switching transistor 202 used as a switching element for controlling an input of a video signal to the pixel, a driving transistor 203 for controlling a current value to be supplied to the light emitting element 201, and a current controlling transistor 204 for controlling the current supply to the light emitting element 201. A capacitor 205 for holding a potential of the video signal may be provided in the pixel as in this embodiment mode.

The driving transistor 203 and the current controlling transistor 204 may have the same polarity or different polarity. The driving transistor 203 may operate in either a linear region or saturation region. The switching transistor 202 and the current controlling transistor 204 operate in a linear region. The driving transistor 203 may be an enhancement mode transistor or a depletion mode transistor. The switching transistor 202 may be either an n-type or p-type transistor.

The gate of the switching transistor 202 is connected to a first scan line Gaj (j=1 to y). One of the source and drain of the switching transistor 202 is connected to the signal line Si (i=1 to x) and the other is connected to the gate of the current controlling transistor 204. The gate of the driving transistor 203 is connected to a second scan line Gbj (j=1 to y). The driving transistor 203 and the current controlling transistor 204 are connected to a power supply line Vi (i=1 to x) and a light emitting element 201 so that the current supplied from the power supply line Vi (i=1 to x) is supplied to the light emitting element 201 as a drain current of the driving transistor 203 and the current controlling transistor 204. In this embodiment mode, the source of the current controlling transistor 204 is connected to the power supply line Vi (i=1 to x) and the drain of the driving transistor 203 is connected to a pixel electrode of the light emitting element 201.

It should be noted that the source of the driving transistor 203 may be connected to the power supply line Vi (i=1 to x) and the drain of the current controlling transistor 204 may be connected to the pixel electrode of the light emitting element 201.

The light emitting element 201 includes an anode, a cathode, and a electroluminescent layer formed between the anode and the cathode. One of the anode and the cathode is the pixel electrode and the other is a counter electrode.

One of two electrodes of the capacitor 205 is connected to the power supply line Vi (i=1 to x) and the other is connected to the gate of the current controlling transistor 204. The capacitor 205 is provided in order to hold the gate voltage of the current controlling transistor 204. Note that the capacitor 205 is provided in FIG. 7A, however, the invention is not exclusively limited to this configuration and the capacitor 205 may not necessarily be provided.

In the case of using p-type transistors as the driving transistor 203 and the current controlling transistor 204 as in FIG. 7A, the drain of the driving transistor 203 and the anode of the light emitting element 201 are desirably connected to each other. That is to say, it is desirable to use the anode as the pixel electrode and the cathode as the counter electrode. In the case of using n-type transistors as the driving transistor 203 and the current controlling transistor 204, on the other hand, the source of the driving transistor 203 and the cathode of the light emitting element 201 are desirably connected to each other. That is to say, it is desirable to use the cathode as the pixel electrode and the anode as the counter electrode.

A driving method of the pixel shown in FIG. 7A is described now. The operation of the pixel shown in FIG. 7A can be described in two periods: a write period and a store period as was in the case of Embodiment Mode 1.

In the write period, current supply to the light emitting element 201 is stopped regardless of the switching of the current controlling transistor 204. Specifically, potential difference between the counter electrode of the light emitting element 201 and the first power supply line Vi (i=1 to x) may be zero as in Embodiment Mode 1. Otherwise, potential difference between the counter electrode and the first power supply line Vi (i=1 to x) may be controlled so that a reverse bias voltage is applied between the pair of electrodes of the light emitting element 201 when it is considered as a diode. Alternatively, current path to the light emitting element 201 may be blocked by a switch and the like. For example, a switch having the structure shown in FIG. 3 can be used. In the pixel shown in FIG. 7A, current path to the light emitting element 201 can be blocked by controlling the potential of the second scan line Gbj to forcibly turn OFF the driving transistor 203. The potential of the counter electrode can be maintained constant even in the write period by stopping the current supply to the light emitting element 201 by using the driving transistor 203 in the pixel. Therefore, power consumption of charging and discharging to the counter electrode when transiting from the write period to the store period and the store period to the write period can be suppressed.

When the first scan line Gaj (j=1 to y) is selected, the switching transistor 202 of which gate is connected to the first scan line Gaj (j=1 to y) is turned ON. Then, video signals inputted to the signal lines S1 to Sx are inputted to the gate of the current controlling transistor 204 through the switching transistor 202. The potential of the video signal is held by the capacitor 205.

After the first scan lines Gaj (j=1 to y) are sequentially selected and the write periods terminate in all pixels, store periods start in all the pixels all at once.

In the store period, potential difference which is high enough to supply a forward bias current to the light emitting element 201 is provided between the counter electrode of the light emitting element 201 and the first power supply line Vi (i=1 to x), therefore, current flows to the light emitting element 201 when the current controlling transistor 204 is ON. Further, the second scan line Gbj (j=1 to y) is selected to apply to the gate of the driving transistor 203 the potential which is high enough to turn ON the driving transistor 203 when the current controlling transistor 204 is ON. In the case where the current controlling transistor 204 is ON by the potential of the video signal held in the capacitor 205, current is supplied to the light emitting element 201 through the power supply line Vi (i=1 to x). The current controlling transistor 204 operates in a linear region, therefore, the current supplied to the light emitting element 101 is determined by the driving transistor 203 and the V-I characteristics of the light emitting element 201. The light emitting element 201 emits light at a luminance according to the supplied current.

On the other hand, in the case where the current controlling transistor 204 is turned OFF by the potential of the video signal held in the capacitor 205, current supply to the light emitting element 201 is stopped. Therefore, the light emitting element 201 remains the non-light emitting state.

Figure 7C:
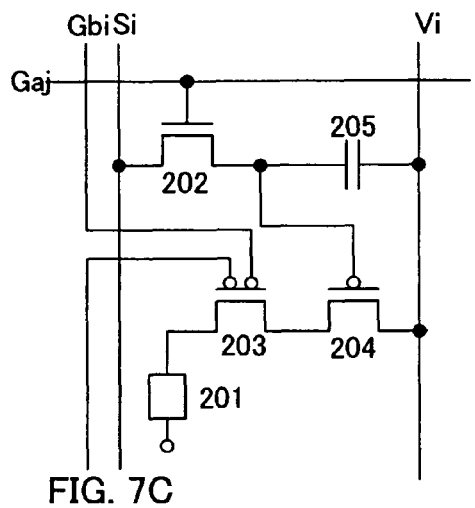
Figure 7D:
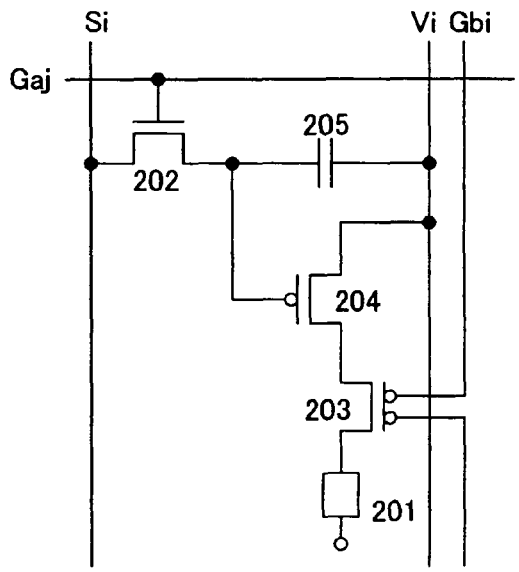
Figure 7E:
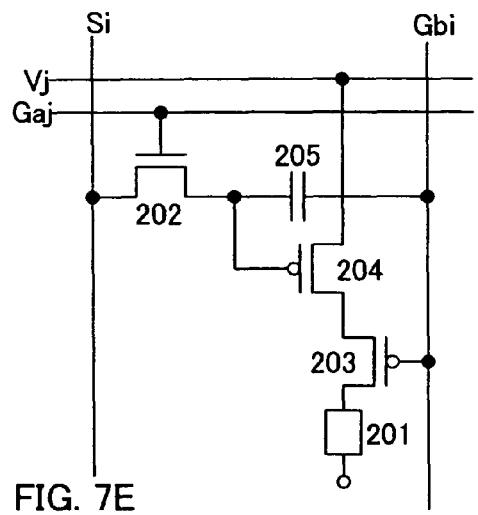

The layout of the second scan line Gbj (j=1 to y) is not limited to the configuration shown in FIG. 7A. For example, the second can line Gbi (i=1 to y) may be crossed with the first scan line Gaj (j=1 to y) to be parallel to the signal line Si. As shown in FIG. 7C, it is also possible among the pixels which commonly use the signal line Si (i=1 to x) to electrically connect a plurality of wirings to the gate electrode of the driving transistor 203 so that the plurality of wirings and the gate electrode of the driving transistor 203 function as the second scan line Gbi (i=1 to y). It should be noted that the driving transistor 203 shown in FIG. 7C has contact regions in two different points of the gate electrode. It is denoted as shown in FIG. 7C because of its special connection. In this case, the plurality of wirings which function as the second scan line Gbi (i=1 to y) may be disposed on the side of the signal line Si (i=1 to x), however, it may be disposed on the side of the power supply line Vi (i=1 to y) as shown in FIG. 7D. Alternatively, a power supply line Vj may be crossed with the signal line Si (i=1 to x) to be parallel to the scan line Gaj (i=1 to y) while the second scan line Gbi (i=1 to y) is crossed with the first scan line Gaj (i=1 to y) to be parallel to the signal line Si (i=1 to x).

[Embodiment Mode 3]

In this embodiment mode, a pixel configuration in the light emitting device of the invention, which is different from Embodiment Modes 1 and 2 is described.

Figure 8A:
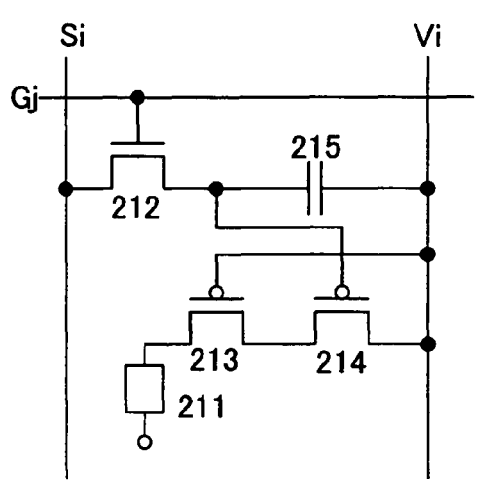
FIGS. 8A and 8B are circuit diagrams of a pixel of the light emitting device of the invention.

FIG. 8A shows a pixel configuration of this embodiment mode. The pixel shown in FIG. 8A includes a light emitting element 211, a switching transistor 212 used as a switching element for controlling an input of a video signal to the pixel, a driving transistor 213 for controlling a current value to be supplied to the light emitting element 211, and a current controlling transistor 214 for controlling a current supply to the light emitting element 211. Further, a capacitor 215 for holding a potential of the video signal may be provided as in this embodiment mode.

The driving transistor 213 and the current controlling transistor 214 may have the same polarity or different polarity. The driving transistor 213 may operate in a saturation region or a linear region. The driving transistor 213 may be an enhancement mode transistor or a depletion mode transistor. The switching transistor 212 may be either an n-type or p-type transistor.

The gate of the switching transistor 212 is connected to the scan line Gj (j=1 to y). One of the source and drain of the switching transistor 212 is connected to the signal line Si (i=1 to x) and the other is connected to the gate of the current controlling transistor 214. The gate of the driving transistor 213 is connected to the first power supply line Vi (i=1 to y). The driving transistor 213 and the current controlling transistor 214 are connected to the first power supply line Vi (i=1 to x) and the light emitting element 211 so that the current supplied from the first power supply line Vi (i=1 to x) is supplied to the light emitting element 211 as a drain current of the driving transistor 213 and the current controlling transistor 214. In this embodiment mode, the source of the current controlling transistor 214 is connected to the power supply line Vi (i=1 to x) and the drain of the driving transistor 213 is connected to a pixel electrode of the light emitting element 211.

It should be noted that the source of the driving transistor 213 may be connected to the power supply line Vi (i=1 to x) and the drain of the current controlling transistor 214 may be connected to the pixel electrode of the light emitting element 211.

The light emitting element 211 includes an anode, a cathode, and a electroluminescent layer formed between the anode and the cathode. One of the anode and the cathode is the pixel electrode and the other is a counter electrode.

One of two electrodes of the capacitor 215 is connected to the power supply line Vi (i=1 to x) and the other is connected to the gate of the current controlling transistor 214. The capacitor 215 is provided in order to hold the gate voltage of the current controlling transistor 214. Note that the capacitor 215 is provided in FIG. 8A, however, the invention is not exclusively limited to this configuration and the capacitor 215 may not necessarily be provided.

In the case of using p-type transistors as the driving transistor 213 and the current controlling transistor 214 as in FIG. 8A, the drain of the driving transistor 213 and the anode of the light emitting element 211 are desirably connected to each other. That is to say, it is desirable to use the anode as the pixel electrode and the cathode as the counter electrode. In the case of using n-type transistors as the driving transistor 213 and the current controlling transistor 214, on the other hand, the source of the driving transistor 213 and the cathode of the light emitting element 211 are desirably connected to each other. That is to say, it is desirable to use the cathode as the pixel electrode and the anode as the counter electrode.

A driving method of the pixel shown in FIG. 8A is described now. The operation of the pixel shown in FIG. 8A can be described in two periods: a write period and a store period as was in the case of Embodiment Mode 1.

In the write period, current supply to the light emitting element 211 is stopped regardless of the switching of the current controlling transistor 214. Specifically, potential difference between the counter electrode of the light emitting element 211 and the first power supply line Vi (i=1 to x) may be zero as in Embodiment Mode 1. Otherwise, potential difference between the counter electrode and the first power supply line Vi (i=1 to x) may be controlled so that a reverse bias voltage is applied between the pair of electrodes of the light emitting element 211 when it is considered as a diode. Alternatively, current path to the light emitting element 211 may be blocked by a switch and the like. For example, a switch having the configuration shown in FIG. 3 can be used.

When the scan line Gj (j=1 to y) is selected, the switching transistor 212 of which gate is connected to the scan line Gj (j=1 to y) is turned ON. Then, video signals inputted to the signal lines S1 to Sx are inputted to the gate of the current controlling transistor 214 through the switching transistor 212. The potential of the video signal is held by the capacitor 215. The first power supply line Vi (i=1 to x) constantly applies a potential to the gate of the driving transistor 213 which is high enough to turn ON the driving transistor 213 when the current controlling transistor 214 is ON. However, the light emitting element 211 remains the non-light emitting state regardless of ON or OFF of the current controlling transistor 214 because current supply to the light emitting element 211 is stopped in the write period as described above.

After the scan lines Gj (j=1 to y) are sequentially selected and the write periods terminate in all pixels, store periods start in all the pixels all at once.

In the store period, potential difference which is high enough to supply a forward bias current to the light emitting element 211 is provided between the counter electrode of the light emitting element 211 and the first power supply line Vi (i=1 to x), therefore, current flows to the light emitting element 211 when the current controlling transistor 214 is ON. Further, the first power supply line Vi (i=1 to x) constantly applies a potential to the gate of the driving transistor 213 which is high enough to turn ON the driving transistor 213 when the current controlling transistor 214 is ON. In the case where the current controlling transistor 214 is ON by the potential of the video signal held in the capacitor 215, current is supplied to the light emitting element 211 through the power supply line Vi (i=1 to x). The current controlling transistor 214 operates in a linear region, therefore, the current supplied to the light emitting element 211 is determined by the driving transistor 213 and the V-I characteristics of the light emitting element 211. The light emitting element 211 emits light at a luminance according to the supplied current.

In the case where the current controlling transistor 214 is turned OFF by the potential of the video signal held in the capacitor 215, current supply to the light emitting element 211 is stopped. Therefore, the light emitting element 211 remains the non-light emitting state.

[Embodiment Mode 4]

In this embodiment mode, a pixel configuration in the light emitting device of the invention which is different from Embodiment Modes 1, 2, and 3 is described.

Figure 8B:
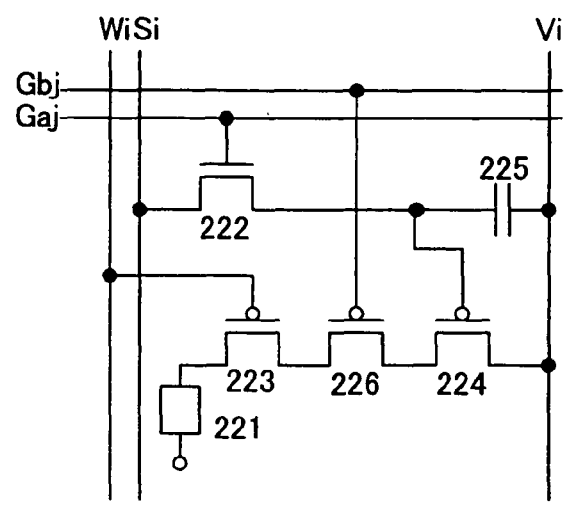

FIG. 8B shows a pixel configuration of this embodiment mode. The pixel shown in FIG. 8B includes a light emitting element 221, a switching transistor 222 used as a switching element for controlling an input of a video signal to the pixel, a driving transistor 223 for controlling a current value to be supplied to the light emitting element 221, a current controlling transistor 224 for controlling a current supply to the light emitting element 221, and a blocking transistor 226 for stopping the current supply to the light emitting element 221 in the write period. Further, a capacitor 225 for holding a potential of the video signal may be provided as in this embodiment mode.

The driving transistor 223, the current controlling transistor 224, and the blocking transistor 226 may have the same polarity or different polarity. The driving transistor 223 may operate in saturation region or a linear region. The switching transistor 222, the current controlling transistor 224, and the blocking transistor 226 operate in a linear region. The driving transistor 223 may be an enhancement mode transistor or a depletion mode transistor. The switching transistor 222 may be either an n-type or p-type transistor.

The gate of the switching transistor 222 is connected to the first scan line Gaj (j=1 to y). One of the source and drain of the switching transistor 222 is connected to the signal line Si (i=1 to x) and the other is connected to the gate of the current controlling transistor 224. The gate of the driving transistor 223 is connected to the second power supply line Wi (i=1 to y). The driving transistor 223, the current controlling transistor 224, and the blocking transistor 226 are connected to the first power supply line Vi (i=1 to x) and a light emitting element 221 so that the current supplied from the first power supply line Vi (i=1 to x) is supplied to the light emitting element 221 as a drain current of the driving transistor 223, the current controlling transistor 224, and the blocking transistor 226. In this embodiment mode, the source of the current controlling transistor 224 is connected to the first power supply line Vi (i=1 to x), the drain of the driving transistor 223 is connected to a pixel electrode of the light emitting element 221, and the blocking transistor 226 is connected between the driving transistor 223 and the current controlling transistor 224 in series.

The connections of the driving transistor 223, the current controlling transistor 224, and the blocking transistor 226 are not limited to the aforementioned configurations. The order of alignment of these three transistors can be appropriately determined by a designer. For example, the source of the driving transistor 223 may be connected to the first power supply line Vi (i=1 to x), the drain of the current controlling transistor 224 may be connected to the pixel electrode of the light emitting element 221, and the blocking transistor 226 may be connected between the driving transistor 223 and the current controlling transistor 224 in series.

The light emitting element 221 includes an anode, a cathode, and an electroluminescent layer formed between the anode and the cathode. One of the anode and the cathode is the pixel electrode and the other is a counter electrode.

One of two electrodes of a capacitor 225 is connected to the first power supply line Vi (i=1 to x) and the other is connected to the gate of the current controlling transistor 224. The capacitor 225 is provided in order to hold the gate voltage of the current controlling transistor 224. Note that the capacitor 225 is provided in FIG. 8B, however, the invention is not exclusively limited to this configuration and the capacitor 225 may not necessarily be provided.

In the case of using p-type transistors as the driving transistor 223 and the current controlling transistor 224 as in FIG. 8B, the drain of the driving transistor 223 and the anode of the light emitting element 221 are desirably connected to each other. That is to say, it is desirable to use the anode as the pixel electrode and the cathode as the counter electrode. In the case of using n-type transistors as the driving transistor 223 and the current controlling transistor 224, on the other hand, the source of the driving transistor 223 and the cathode of the light emitting element 221 are desirably connected to each other. That is to say, it is desirable to use the cathode as the pixel electrode and the anode as the counter electrode.

A driving method of the pixel shown in FIG. 8B is described now. The operation of the pixel shown in FIG. 8B can be described in two periods: a write period and a store period as was in the case of Embodiment Mode 1.

In the write period, current supply to the light emitting element 221 is stopped regardless of the switching of the current controlling transistor 224. Specifically, potential difference between the counter electrode of the light emitting element 221 and the first power supply line Vi (i=1 to x) may be zero as in Embodiment Mode 1. Otherwise, potential difference between the counter electrode and the first power supply line Vi (i=1 to x) may be controlled so that a reverse bias voltage is applied between the pair of electrodes of the light emitting element 221 when it is considered as a diode. Alternatively, current path to the light emitting element 221 may be blocked by a switch and the like. For example, a switch having the configuration shown in FIG. 3 can be used. In the pixel shown in FIG. 8B, current path to the light emitting element 221 can be blocked by controlling the potential of the second scan line Gbj to forcibly turn OFF the blocking transistor 226. The potential of the counter electrode can be maintained constant even in the write period by blocking the current supply to the light emitting element 221 by using the blocking transistor 226 in the pixel. Therefore, power consumption of charging and discharging to the counter electrode when transiting from the write period to the store period and the store period to the write period can be suppressed. As the blocking transistor 226 operates in a linear region, change in the gate voltage can be small when switched over as compared to a transistor which operates in a saturation region. Thus, power consumption can be reduced.

When the first scan line Gaj (j=1 to y) is selected, the switching transistor 222 of which gate is connected to the first scan line Gaj (j=1 to y) is turned ON. Then, video signals inputted to the signal lines S1 to Sx are inputted to the gate of the current controlling transistor 224 through the switching transistor 222. The potential of the video signal is held by the capacitor 225. The second power supply line Wi (i=1 to x) constantly applies a potential to the gate of the driving transistor 223 which is high enough to turn ON the driving transistor 223 when the current controlling transistor 224 and the blocking transistor 226 are ON. However, the light emitting element 221 remains the non-light emitting state regardless of ON or OFF of the current controlling transistor 224 because current supply to the light emitting element 221 is stopped in the write period as described above.

After the scan lines Gaj are sequentially selected and the write periods terminate in all pixels, store periods start in all the pixels all at once.

In the store period, the second scan line Gbj (j=1 to y) is selected to turn ON the blocking transistor 226 of which gate is connected to the second scan line Gbj (j=1 to y). Potential difference which is high enough to supply a forward bias current to the light emitting element 221 is provided between the counter electrode of the light emitting element 221 and the first power supply line Vi (i=1 to x), therefore, current flows to the light emitting element 221 when the current controlling transistor 224 is ON. Further, the second power supply line Wi (i=1 to x) constantly applies a potential to the gate of the driving transistor 223 which is high enough to turn ON the driving transistor 223 when the current controlling transistor 224 and the blocking transistor are ON. In the case where the current controlling transistor 224 is ON by the potential of the video signal held in the capacitor 225, current is supplied to the light emitting element 221 through the first power supply line Vi (i=1 to x). The current controlling transistor 224 operates in a linear region, therefore, the current supplied to the light emitting element 221 is determined by the driving transistor 223 and the V-I characteristics of the light emitting element 221. The light emitting element 221 emits light at a luminance according to the supplied current.

In the case where the current controlling transistor 224 is turned OFF by the potential of the video signal held in the capacitor 225, current supply to the light emitting element 221 is stopped. Therefore, the light emitting element 221 remains the non-light emitting state.

[Embodiment Mode 5]

In this embodiment mode, a pixel configuration in the light emitting device of the invention which is different from Embodiment Modes 1 to 4 is described.

Figure 9A:
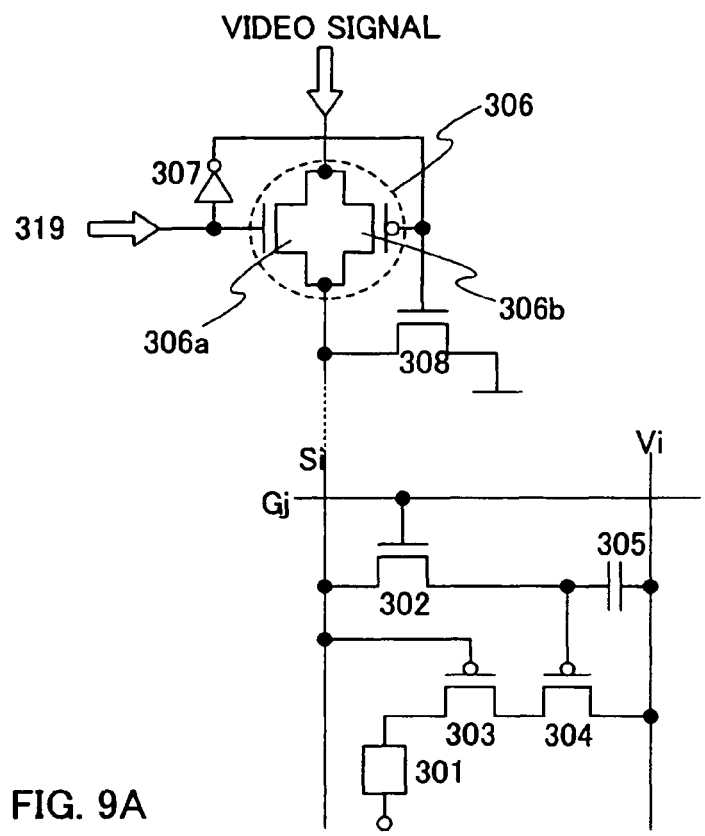
FIGS. 9A and 9B are circuit diagrams of a pixel of the light emitting device of the invention.

FIG. 9A shows a pixel configuration of this embodiment mode. The pixel shown in FIG. 9A includes a light emitting element 301, a switching transistor 302 used as a switching element for controlling an input of a video signal to the pixel, a driving transistor 303 for controlling a current value to be supplied to the light emitting element 301, and a current controlling transistor 304 for controlling a current supply to the light emitting element 301. Further, a capacitor 305 for holding a potential of the video signal may be provided as in this embodiment mode.

The driving transistor 303 and the current controlling transistor 304 may have the same polarity or different polarity. The driving transistor 303 may operate in saturation region or a linear region. The switching transistor 302 and the current controlling transistor 304 operate in a linear region. The driving transistor 303 may be an enhancement mode transistor or a depletion mode transistor. The switching transistor 302 may be either an n-type or p-type transistor.

The gate of the switching transistor 302 is connected to the first scan line Gj (j=1 to y). One of the source and drain of the switching transistor 302 is connected to the signal line Si (i=1 to x) and the other is connected to the gate of the current controlling transistor 304. The gate of the driving transistor 303 is connected to the signal line Si (i=1 to y). The driving transistor 303 and the current controlling transistor 304 are connected to the power supply line Vi (i=1 to x) and the light emitting element 301 so that the current supplied from the first power supply line Vi (i=1 to x) is supplied to the light emitting element 301 as a drain current of the driving transistor 303 and the current controlling transistor 304. In this embodiment mode, the source of the current controlling transistor 304 is connected to the first power supply line Vi (i=1 to x) and the drain of the driving transistor 303 is connected to a pixel electrode of the light emitting element 301.

The connections of the driving transistor 303 and the current controlling transistor 304 are not limited to the aforementioned configurations. For example, the source of the driving transistor 303 may be connected to the first power supply line Vi (i=1 to x) and the drain of the current controlling transistor 304 may be connected to the pixel electrode of the light emitting element 301.

The light emitting element 301 includes an anode, a cathode, and a electroluminescent layer formed between the anode and the cathode. One of the anode and the cathode is the pixel electrode and the other is a counter electrode.

One of two electrodes of a capacitor 305 is connected to the first power supply line Vi (i=1 to x) and the other is connected to the gate of the current controlling transistor 304. The capacitor 305 is provided in order to hold the gate voltage of the current controlling transistor 304. Note that the capacitor 305 is provided in FIG. 9A, however, the invention is not exclusively limited to this configuration and the capacitor 305 may not necessarily be provided.

In the case of using p-type transistors as the driving transistor 303 and the current controlling transistor 304 as in FIG. 9A, the drain of the driving transistor 303 and the anode of the light emitting element 301 are desirably connected to each other. That is to say, it is desirable to use the anode as the pixel electrode and the cathode as the counter electrode. In the case of using n-type transistors as the driving transistor 303 and the current controlling transistor 304, on the other hand, the source of the driving transistor 303 and the cathode of the light emitting element 301 are desirably connected to each other. That is to say, it is desirable to use the cathode as the pixel electrode and the anode as the counter electrode.

A driving method of the pixel shown in FIG. 9A is described now. The operation of the pixel shown in FIG. 9A can be described in two periods: a write period and a store period as in Embodiment Mode 1.

In the write period, current supply to the light emitting element 301 is stopped regardless of the switching of the current controlling transistor 304. Specifically, potential difference between the counter electrode of the light emitting element 301 and the first power supply line Vi (i=1 to x) may be zero as in Embodiment Mode 1. Otherwise, potential difference between the counter electrode and the first power supply line Vi (i=1 to x) may be controlled so that a reverse bias voltage is applied between the pair of electrodes of the light emitting element 301 when it is considered as a diode. Alternatively, current path to the light emitting element 301 may be blocked by a switch and the like. For example, a switch having the configuration shown in FIG. 3 can be used.

When the scan line Gj (j=1 to y) is selected in the write period, the switching transistor 302 of which gate is connected to the scan line Gj (j=1 to y) is turned ON. Then, video signals inputted to the signal lines S1 to Sx are inputted to the gate of the current controlling transistor 304 through the switching transistor 302. The potential of the video signal is held by the capacitor 305. The signal line Si (i=1 to x) may apply a potential to the gate of the driving transistor 303 which is high enough to turn ON the driving transistor 303 when the current controlling transistor 304 is ON. However, the light emitting element 301 remains the non-light emitting state regardless of ON or OFF of the current controlling transistor 304 because current supply to the light emitting element 301 is stopped in the write period as described above.

After the scan lines Gj are sequentially selected and the write periods terminate in all pixels, store periods start in all the pixels all at once.

In the store period, a fixed potential is applied to the signal line Si (i=1 to x). As the switching transistor 302 is OFF in the store period, the fixed potential applied to the signal line Si is applied to the gate of the driving transistor 303. The fixed potential applied to the signal line Si is set high enough to turn ON the driving transistor 303 when the current controlling transistor 304 is ON. Further in the store period, a potential difference which is high enough to supply a forward bias current to the light emitting element 301 is provided between the counter electrode of the light emitting element 301 and the first power supply line Vi (i=1 to x), therefore, current flows to the light emitting element 301 when the current controlling transistor 304 is ON. In the case where the current controlling transistor 304 is ON by the potential of the video signal held in the capacitor 305, current is supplied to the light emitting element 301 through the first power supply line Vi (i=1 to x). The current controlling transistor 304 operates in a linear region, therefore, the current supplied to the light emitting element 301 is determined by the driving transistor 303 and the V-I characteristics of the light emitting element 301. The light emitting element 301 emits light at a luminance according to the supplied current.

In the case where the current controlling transistor 304 is turned OFF by the potential of the video signal held in the capacitor 305, current supply to the light emitting element 301 is stopped. Therefore, the light emitting element 301 remains the non-light emitting state.

In this embodiment mode, a potential of the video signal is applied to the signal line Si (i=1 to x) in the write period while a fixed potential is applied to the signal line Si (i=1 to x) in the store period which is high enough to turn ON the driving transistor 303 when the current controlling transistor 304 is ON. The potential to be applied to the signal line Si (i=1 to x) can be changed over by using a circuit element such as a single or a plurality of switching elements. For example, a potential to be applied to the signal line Si (i=1 to x) is changed over by using a transmission gate 306, a transistor 308, and an inverter 307 in FIG. 9A.

Specifically, the transmission gate 306 includes an n-type transistor 306a and a p-type transistor 306b of which sources and drains are connected to each other. Signals which are inverted from each other are inputted to the gate of the n-type transistor 306a and the gate of the p-type transistor 306b through the inverter 307. One of the gate of the n-type transistor 306a and the p-type transistor 306b is connected to the gate of the transistor 308 while the other is supplied with a potential of a signal (light emission control signal 319) having data of timing to change over the potential to be applied to the signal line Si (i=1 to x) is applied to the gate of the other. FIG. 9A shows an example that the gate of the p-type transistor 306b and the gate of the transistor 308 are connected to each other and a potential of the light emission control signal is applied to the gate of the n-type transistor 306a. Note that the polarity of the transistor 308 is set to be the same as a transistor of which gate is applied the potential of the light emission control signal among the two transistors in the transmission gate 306. Therefore, the transistor 308 is an n-type transistor in FIG. 9A.

A potential of the video signal is applied to the source of the n-type transistor 306a and the source of the p-type transistor 306b. The potentials of the drain of the n-type transistor 306a and the drain of the p-type transistor 306b are applied to the signal line Si. A potential which is high enough to turn ON the driving transistor 303 when the current controlling transistor 304 is ON is applied to one of the source and drain of the transistor 308 while the other is connected to the signal line Si (i=1 to x).

When the n-type transistor 306a and the p-type transistor 306b are turned ON and the transistor 308 is turned OFF by the light emission control signal, a potential of the video signal is applied to the signal line Si. On the other hand, when the n-type transistor 306a and the p-type transistor 306b are turned OFF and the transistor 308 is turned ON by the light emission control signal, a fixed potential which is high enough to turn ON the driving transistor 303 when the current controlling transistor 304 is ON is applied to the signal line Si.

As described in this embodiment mode, the number of wirings for supplying a signal or potential to the pixel can be suppressed by changing over the potential of the signal line Si in the write period and the store period.

[Embodiment Mode 6]

In this embodiment mode, a pixel configuration in the light emitting device of the invention which is different from Embodiment Modes 1 to 5 is described.

Figure 9B:
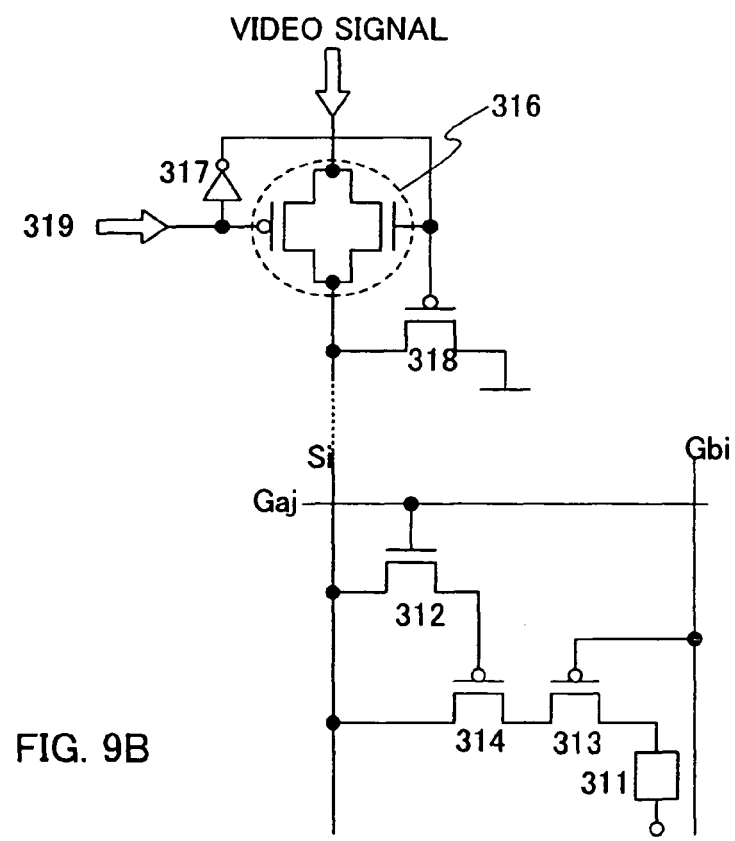

FIG. 9B shows a pixel configuration of this embodiment mode. The pixel shown in FIG. 9B includes a light emitting element 311, a switching transistor 312 used as a switching element for controlling an input of a video signal to the pixel, a driving transistor 313 for controlling a current value to be supplied to the light emitting element 311, and a current controlling transistor 314 for controlling a current supply to the light emitting element 311. Further, a capacitor for holding a potential of the video signal may be provided as in this embodiment mode.

The driving transistor 313 and the current controlling transistor 314 may have the same polarity or different polarity. The driving transistor 313 may operate in saturation region or a linear region. The switching transistor 312 and the current controlling transistor 314 operate in a linear region. The driving transistor 313 may be an enhancement mode transistor or a depletion mode transistor. The switching transistor 312 may be either an n-type or p-type transistor.

The gate of the switching transistor 312 is connected to the first scan line Gaj (j=1 to y). One of the source and drain of the switching transistor 312 is connected to the signal line Si (i=1 to x) and the other is connected to the gate of the current controlling transistor 314. The gate of the driving transistor 313 is connected to the second scan line Gbi (i=1 to x). The driving transistor 313 and the current controlling transistor 314 are connected to the signal line Si (i=1 to x) and the light emitting element 311 so that the current supplied from the signal line Si (i=1 to x) is supplied to the light emitting element 311 as a drain current of the driving transistor 313 and the current controlling transistor 314. In this embodiment mode, the source of the current controlling transistor 314 is connected to the signal line Si (i=1 to x) and, the drain of the driving transistor 313 is connected to a pixel electrode of the light emitting element 311.

The connections of the driving transistor 313 and the current controlling transistor 314 are not limited to the aforementioned configurations. For example, the source of the driving transistor 313 may be connected to the signal line Si (i=1 to x) and the drain of the current controlling transistor 314 may be connected to the pixel electrode of the light emitting element 311.

The light emitting element 311 includes an anode, a cathode, and an electroluminescent layer formed between the anode and the cathode. One of the anode and the cathode is the pixel electrode and the other is a counter electrode.

In the case of using p-type transistors as the driving transistor 313 and the current controlling transistor 314 as in FIG. 9B, the drain of the driving transistor 313 and the anode of the light emitting element 311 are desirably connected to each other. That is to say, it is desirable to use the anode as the pixel electrode and the cathode as the counter electrode. In the case of using n-type transistors as the driving transistor 313 and the current controlling transistor 314, on the other hand, the source of the driving transistor 313 and the cathode of the light emitting element 311 are desirably connected to each other. That is to say, it is desirable to use the cathode as the pixel electrode and the anode as the counter electrode.

A driving method of the pixel shown in FIG. 9B is described now. The operation of the pixel shown in FIG. 9B can be described in two periods: a write period and a store period as was in the case of Embodiment Mode 1.

In the write period, current supply to the light emitting element 311 is stopped regardless of the switching of the current controlling transistor 314. Specifically, potential difference between the counter electrode of the light emitting element 311 and the first power supply line Vi (i=1 to x) may be zero as in Embodiment Mode 1. Otherwise, potential difference between the counter electrode and the first power supply line Vi (i=1 to x) may be controlled so that a reverse bias voltage is applied between a pair of electrodes of the light emitting element 311 when it is considered as a diode. Alternatively, current path to the light emitting element 311 may be blocked by a switch and the like. For example, a switch having the configuration shown in FIG. 3 can be used. In the pixel shown in FIG. 9B, current path to the light emitting element 311 can be blocked by controlling the potential of the second scan line Gbi (i=1 to x) to forcibly turn OFF the driving transistor 313. The potential of the counter electrode can be maintained constant even in the write period by stopping the current supply to the light emitting element 311 by using the driving transistor 313 in the pixel. Therefore, power consumption of charging and discharging to the counter electrode when transiting from the write period to the store period and the store period to the write period can be suppressed.

When the first scan line Gaj (j=1 to y) is selected, the switching transistor 312 of which gate is connected to the first scan line Gaj (j=1 to y) is turned ON. Then, video signals inputted to the signal lines S1 to Sx are inputted to the gate of the current controlling transistor 314 through the switching transistor 312.

After the scan lines Gaj are sequentially selected and the write periods terminate in all pixels, store periods start in all the pixels all at once.

In the store period, a fixed potential is applied to the signal line Si (i=1 to x). The fixed potential applied to the signal line Si (i=1 to x) is set high enough to supply a forward bias current to the light emitting element 311 when the current controlling transistor 314 is ON. Further in the store period, current is supplied to the light emitting element 311 when the current controlling transistor 314 is ON. In the case where the current controlling transistor 314 is ON by the potential of the video signal inputted in the write period, current is supplied to the light emitting element 311 through the signal line Si (i=1 to x). The current controlling transistor 314 operates in a linear region, therefore, the current supplied to the light emitting element 311 is determined by the driving transistor 313 and the V-I characteristics of the light emitting element 311. The light emitting element 311 emits light at a luminance according to the supplied current.

In the case where the current controlling transistor 314 is turned OFF by the potential of the video signal, current supply to the light emitting element 311 is stopped. Therefore, the light emitting element 311 remains the non-light emitting state.

In this embodiment mode, a potential of the video signal is applied to the signal line Si in the write period while a fixed potential is supplied to the signal line Si in the store period which is high enough to apply a forward bias current to the light emitting element 311. The potential to be applied to the signal line Si can be changed over by using a circuit element such as a single or a plurality of switching elements. In FIG. 9B, for example, a potential to be supplied to the signal line Si is changed over by using a transmission gate 316, a transistor 318, and an inverter 317 as in FIG. 9A.

As described in this embodiment mode, the number of wirings for supplying a signal or potential to the pixel can be suppressed by changing over the potential of the signal line Si in the write period and the store period.

When the driving transistor 313 operates in a saturation region, in particular, white balance can be controlled by changing a fixed potential which is high enough to supply a forward bias current to the light emitting element 311 in each of the pixels corresponding to red (R), green (G), and blue (B).

[Embodiment 1]

Figure 10:
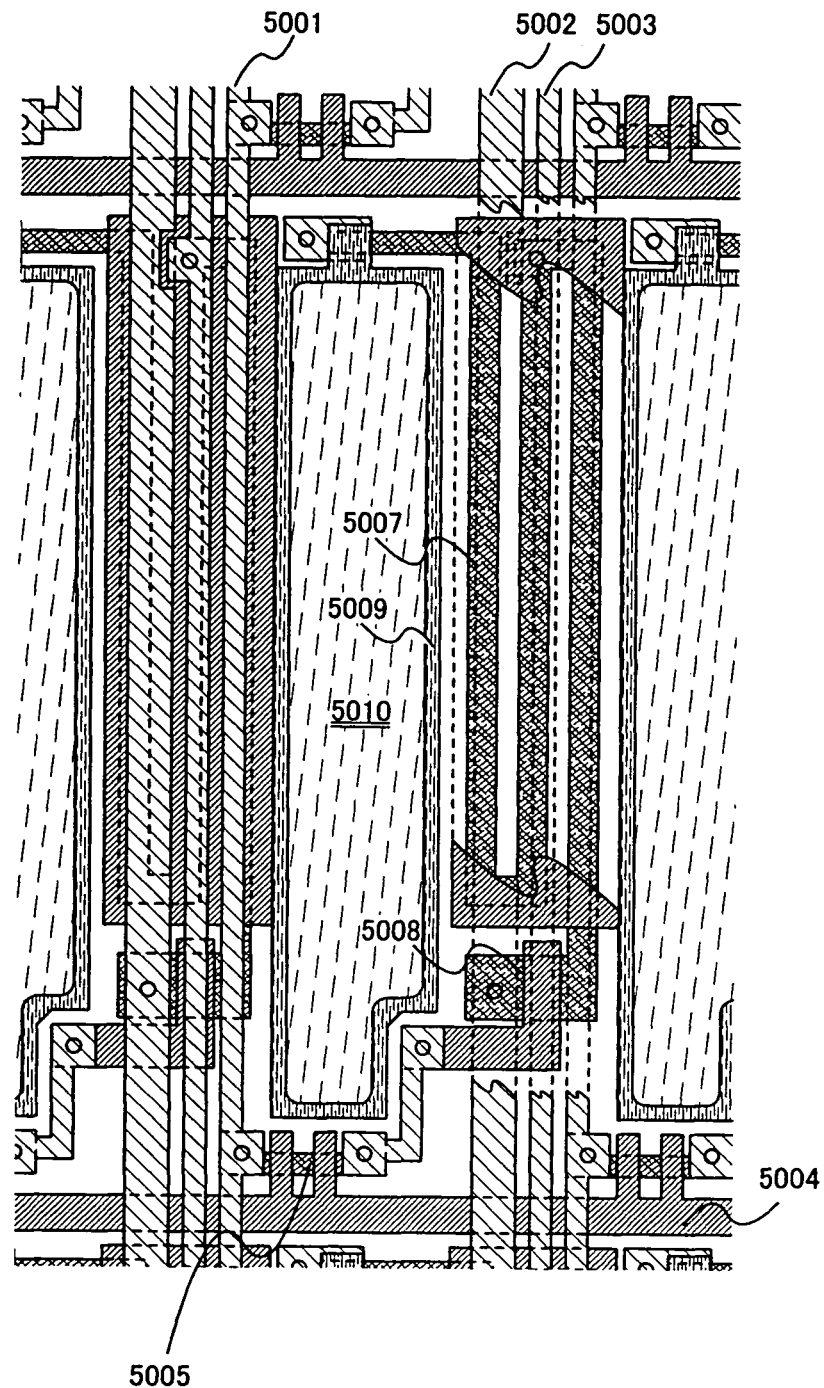
FIG. 10 is a top plan view of a pixel of the light emitting device shown in FIG. 1.

In this embodiment, one mode of a top plan view of the pixel shown in FIG. 1 is described. FIG. 10 shows a top plan view of this embodiment.

A reference numeral 5001 denotes a signal line, 5002 denotes a first power supply line, 5003 denotes a second power supply line, and 5004 denotes a scan line. In this embodiment, the signal line 5001, the first power supply line 5002 and the second power supply line 5003 are formed with the same conductive film. A reference numeral 5005 denotes a switching transistor and a part of the scan line 5004 functions as a gate electrode of the switching transistor 5005. A reference numeral 5007 denotes a driving transistor and 5008 denotes a current controlling transistor. An active layer of the driving transistor 5007 is serpentine so that the L/W thereof becomes larger than that of the current controlling transistor 5008. A reference numeral 5009 denotes a pixel electrode of which overlapped region (light emitting area) 5010 with an electroluminescent layer and a cathode (both not shown) emits light.

The top plan view of the invention is only one of a variety of modes, and it is needless to say that the invention is not limited to this.

[Embodiment 2]

Figure 11:
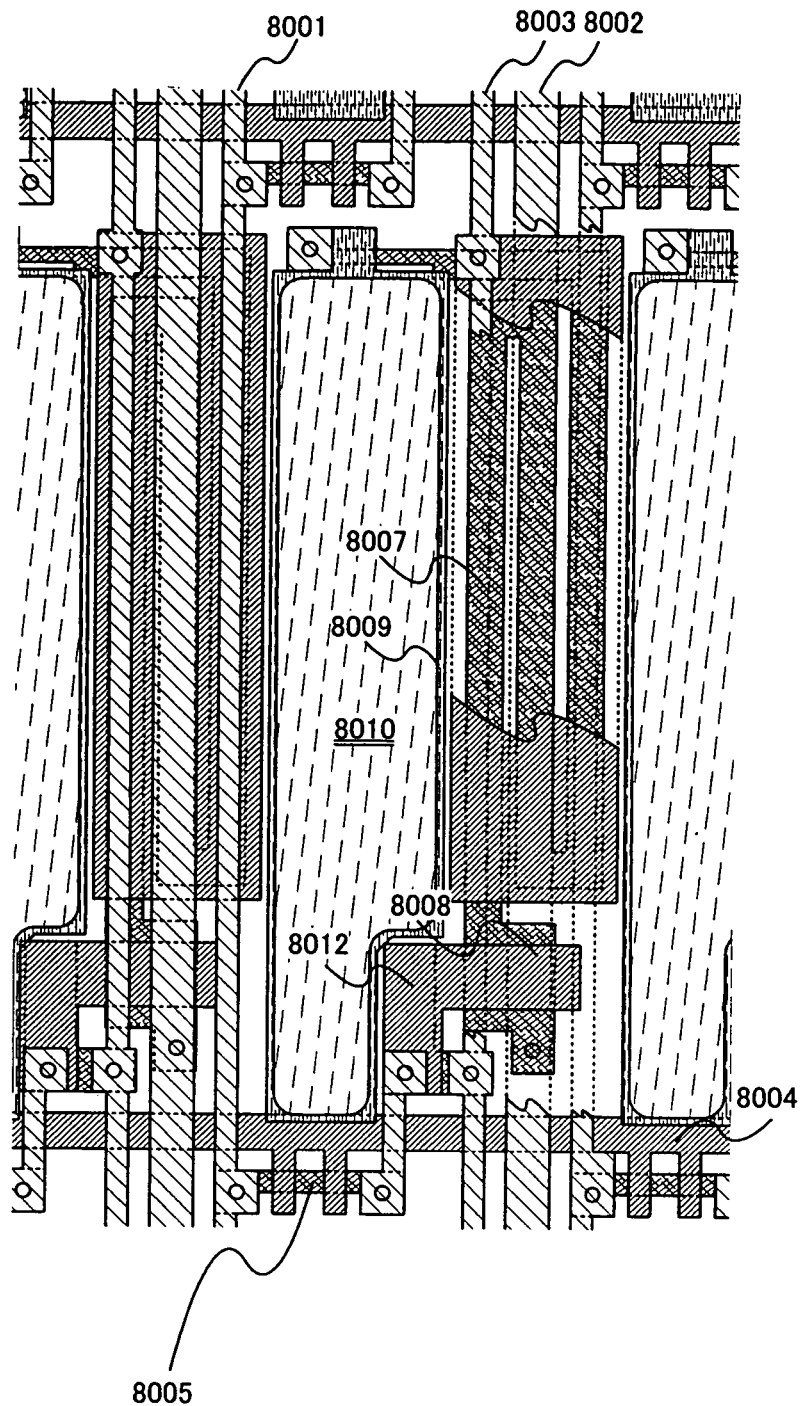
FIG. 11 a top plan view of a pixel of the light emitting device shown in FIG. 1.

In this embodiment, one mode of a top plan view of the pixel shown in FIG. 1 which is different from FIG. 10 is described. FIG. 11 shows a top plan view of the pixel of this embodiment.

A reference numeral 8001 denotes a signal line, 8002 denotes a first power supply line, 8003 denotes a second power supply line, and 8004 denotes a scan line. In this embodiment, the signal line 8001 and the first power supply line 8002 and the second power supply line 8003 are formed with the same conductive film. A reference numeral 8005 denotes a switching transistor and a part of the first scan line 8004 functions as a gate electrode of the switching transistor 8005. A reference numeral 8007 denotes a driving transistor and 8008 denotes a current controlling transistor. An active layer of the driving transistor 8007 is serpentine so that the L/W thereof becomes larger than that of the current controlling transistor 8008. A reference numeral 8009 denotes a pixel electrode of which overlapped region (light emitting area) 8010 with an electroluminescent layer and a cathode (both not shown) emits light.

The top plan view of the invention is only one of a variety of modes, and it is needless to say that the invention is not limited to this.

[Embodiment 3]

A transistor used in the invention may be formed by amorphous silicon. By forming a transistor by using amorphous silicon, fabrication method can be simplified as crystallization process is not required, thus cost reduction can be achieved. However, an n-type transistor formed by amorphous silicon has higher mobility and more suitable for the use in a pixel in a light emitting device than a p-type transistor. In this embodiment, a cross sectional structure of the pixel in the case of using an n-type driving transistor is described.

Figure 12A:
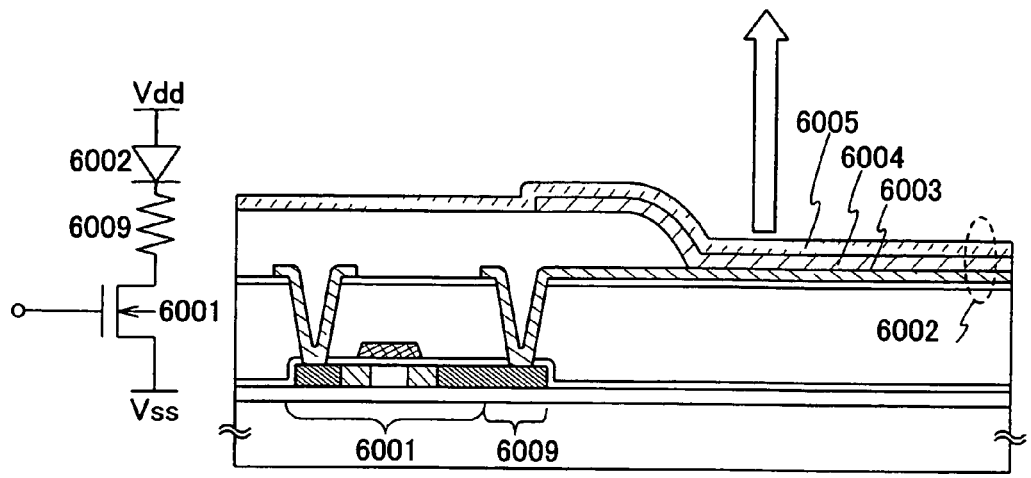
FIGS. 12A and 12B show cross sectional structures of a pixel of the light emitting device of the invention as examples.

FIG. 12A shows a cross sectional view of the pixel in the case where a driving transistor 6001 is an n-type transistor and the light is emitted from a light emitting element 6002 to an anode 6005 side. In FIG. 12A, a cathode 6003 of the light emitting element 6002 and the driving transistor 6001 are electrically connected, and an electroluminescent layer 6004 and the anode are laminated on the cathode 6003 in this order. The cathode 6003 can be formed by using a known material as long as it is a conductive film having a small work function and being capable of reflecting light. For example, Ca, Al, CaF, MgAg, AlLi and the like are desirable. The electroluminescent layer 6004 may be formed by a single layer or a lamination of a plurality of layers. In the case where the electroluminescent layer 6004 is formed by a plurality of layers, an electron injection layer, an electron transporting layer, a light emitting layer, a hole transporting layer, and a hole injection layer are laminated on the cathode 6003 in this order. Note that not all of these layers are required to be formed. The anode 6005 may be a light transmitting conductive film such as ITO, ITSO, and IZO in which zinc oxide (ZnO) is mixed with indium oxide in the concentration of 2 to 20%.

An overlapped portion of the cathode 6003, the electroluminescent layer 6004, and the anode 6005 corresponds to the light emitting element 6002. In the pixel shown in FIG. 12A, light is emitted from the light emitting element 6002 to the anode 6005 side as shown by a hollow arrow.

A portion of an active layer of the driving transistor 6001 functions as a resistor 6009.

Figure 12B:
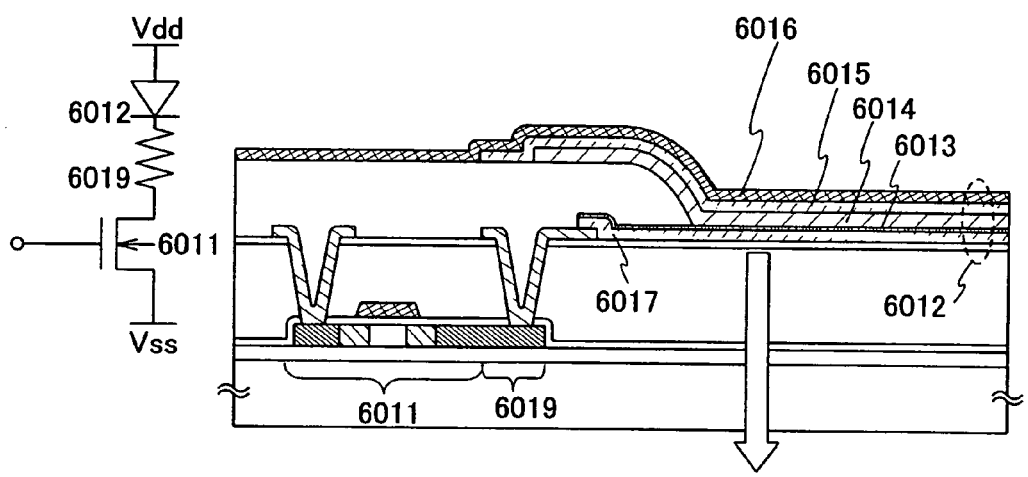

FIG. 12B is a cross sectional view of a pixel in the case where a driving transistor 6011 is an n-type transistor and the light is emitted from a light emitting element 6012 to a cathode 6013 side. In FIG. 12B, the cathode 6013 of the light emitting element 6012, an electroluminescent layer 6014, and an anode 6015 are formed in this order on a light transmitting conductive film 6017 which is electrically connected to the driving transistor 6011. A shielding film 6016 for reflecting or shielding the light is formed so as to cover the anode 6015. The cathode 6013 can be formed by using a known material as long as it is a conductive film having a small work function and being capable of reflecting light as in FIG. 12A. However, its thickness is required to be thin enough to transmit light. For example, Al film of 20 nm in thickness can be used as the cathode 6013. The electroluminescent layer 6014 may be formed by a single layer or a lamination of a plurality of layers as in FIG. 12A. The anode 6015 is not required to transmit light, however, it may be formed by using a light transmitting conductive layer, TiN or Ti. The shielding film 6016 may be formed by using a metal and the like which reflects light, however, it is not limited to a metal film. For example, resin and the like added black pigment can be used as well.

An overlapped portion of the cathode 6013, the electroluminescent layer 6014, and the anode 6015 corresponds to the light emitting element 6012. In the pixel shown in FIG. 12B, light is emitted from the light emitting element 6012 to the anode 6015 side as shown by a hollow arrow.

A portion of an active layer of the driving transistor 6011 functions as a resistor 6019.

In this embodiment, the driving transistor and the light emitting element are electrically connected as an example, however, a current controlling transistor or a blocking transistor may be connected between the driving transistor and the light emitting element.

[Embodiment 4]

In this embodiment mode, a cross sectional structure of a pixel in the case where a driving transistor is a p-type transistor is described.

Figure 13A:
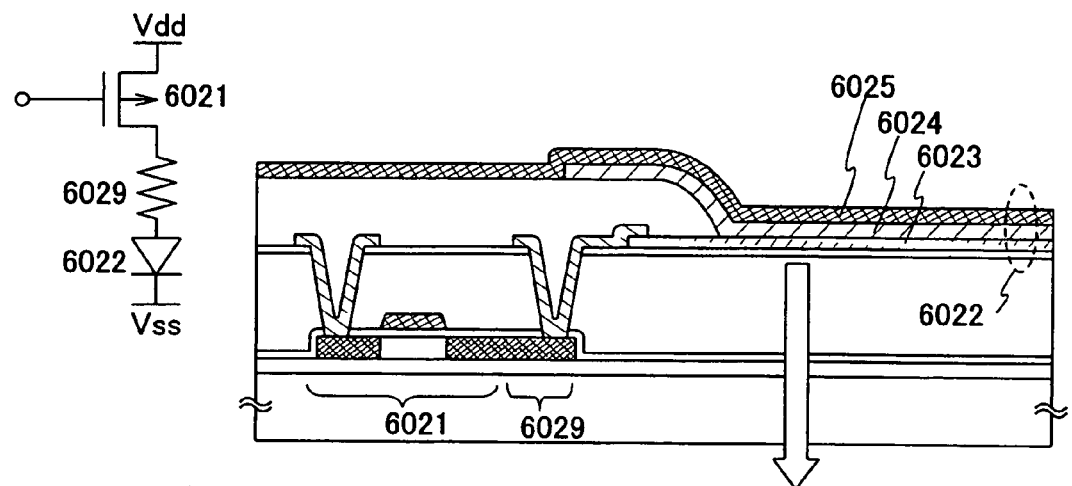
FIGS. 13A and 13B show cross sectional structures of a pixel of the light emitting device of the invention as examples.

FIG. 13A is a cross sectional view of a pixel in the case where a driving transistor 6021 is a p-type transistor and the light is emitted from a light emitting element 6022 to an anode 6023 side. In FIG. 13A, the anode 6023 of the light emitting element 6022 and the driving transistor 6021 are electrically connected, and an electroluminescent layer 6024 and a cathode 6025 are laminated on the anode 6023 in this order. The cathode 6025 can be formed by using a known material as long as it is a conductive film having a small work function and being capable of reflecting light. For example, Ca, Al, CaF, MgAg, AlLi and the like are desirable. The electroluminescent layer 6024 may be formed by a single layer or a lamination of a plurality of layers. In the case where the electroluminescent layer 6024 is formed by a plurality of layers, a hole injection layer, a hole transporting layer, a light emitting layer, an electron transporting layer, and an electron injection layer are laminated on the anode 6023 in this order. Note that not all of these layers are required to be formed. The anode 6023 may be a light transmitting conductive film such as ITO, ITSO, and IZO in which zinc oxide (ZnO) is mixed with indium oxide in the concentration of 2 to 20%.

An overlapped portion of the anode 6023, the electroluminescent layer 6024, and the cathode 6025 corresponds to the light emitting element 6022. In the pixel shown in FIG. 13A, light is emitted from the light emitting element 6022 to the anode 6023 side as shown by a hollow arrow.

A portion of an active layer of the driving transistor 6021 functions as a resistor 6029.

Figure 13B:
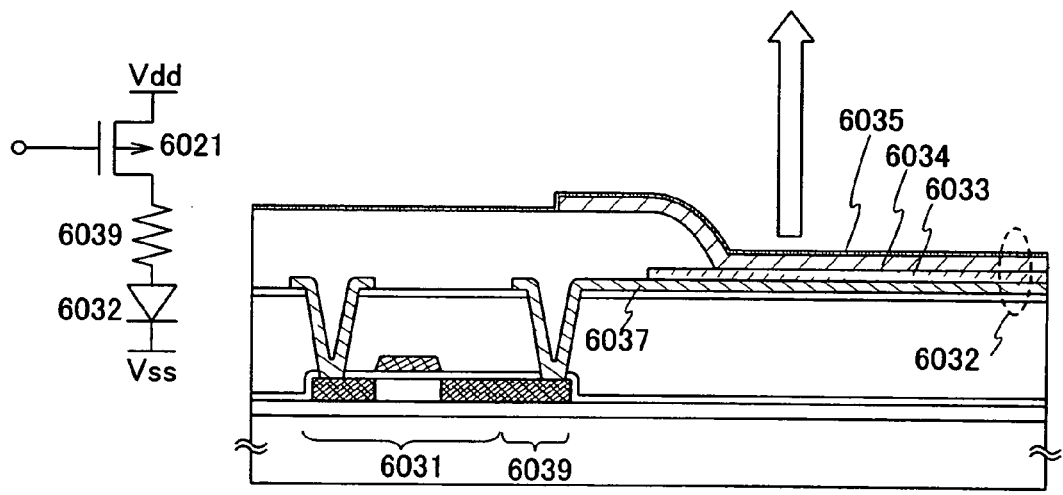

FIG. 13B is a cross sectional view of a pixel in the case where a driving transistor 6031 is a p-type transistor and the light is emitted from a light emitting element 6032 to a cathode 6035 side. In FIG. 13B, the anode 6033 of the light emitting element 6032, an electroluminescent layer 6034, and a cathode 6035 are formed in this order on a wiring 6037 which is electrically connected to the driving transistor 6031. With the aforementioned structure, light transmitted through the anode 6033 is reflected on the wiring 6037. The cathode 6035 can be formed by using a known material as long as it is a conductive film having a small work function and being capable of reflecting light as in FIG. 13A. However, its thickness is required to be thin enough to transmit light. For example, Al film of 20 nm in thickness can be used as the cathode 6035. The electroluminescent layer 6034 may be formed by a single layer or a lamination of a plurality of layers as in FIG. 13A. The anode 6033 is not required to transmit light, however, it may be formed by using a light transmitting conductive layer, TiN or Ti. The shielding film 6036 may be formed by using a metal and the like which reflects light, however, it is not limited to a metal film. For example, resin and the like added black pigment can be used as well.

An overlapped portion of the anode 6033, the electroluminescent layer 6034, and the cathode 6035 corresponds to the light emitting element 6032. In the pixel shown in FIG. 13B, light is emitted from the light emitting element 6032 to the cathode 6035 side as shown by a hollow arrow.

A portion of an active layer of the driving transistor 6031 functions as a resistor 6039.

In this embodiment, the driving transistor and the light emitting element are electrically connected as an example, however, a current controlling transistor or a blocking transistor may be connected between the driving transistor and the light emitting element.

[Embodiment 5]

In this embodiment mode, a cross sectional structure of a pixel in the case where a driving transistor and a current controlling transistor are both bottom gate type transistors is described.

A transistor used in the invention may be formed by amorphous silicon. By forming a transistor by using amorphous silicon, fabrication method can be simplified as crystallization process is not required, thus cost reduction can be achieved. However, an n-type transistor formed by amorphous silicon has higher mobility and more suitable for the use in a pixel in a light emitting device than a p-type transistor. In this embodiment, a cross sectional structure of the pixel in the case of using an n-type driving transistor is described.

Figure 14:
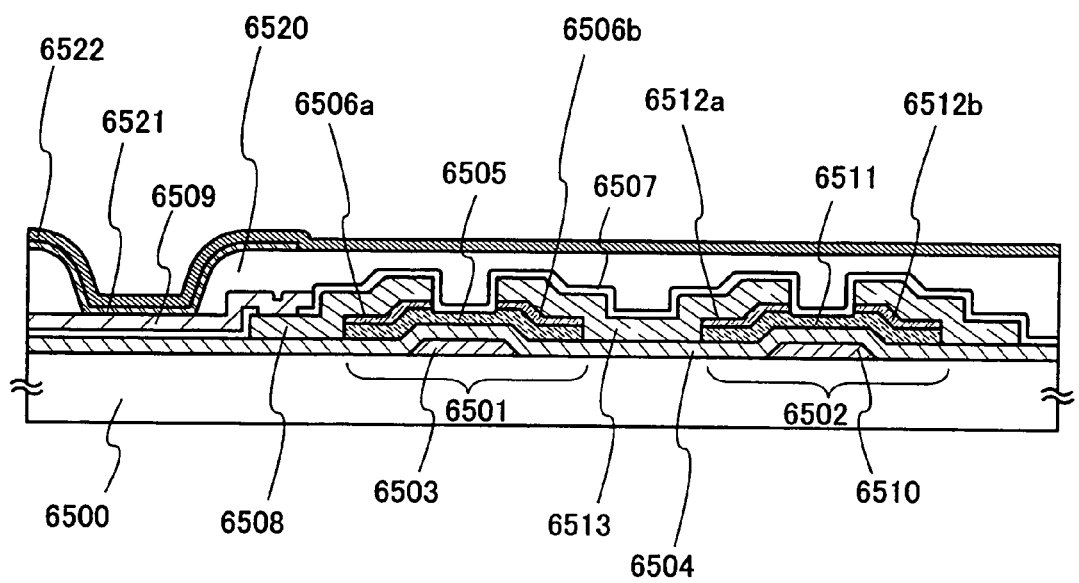
FIG. 14 shows a cross sectional structure of a pixel of the light emitting device of the invention as an example.

FIG. 14 shows a cross sectional view of a pixel of this embodiment. A reference numeral 6501 denotes a driving transistor and 6502 denotes a current controlling transistor. The driving transistor 6501 includes a gate electrode 6503 formed on a substrate 6500 having an insulating surface, a gate insulating film 6504 formed over the substrate 6500 so as to cover the gate electrode 6503, and a semiconductor film 6505 formed so as to overlap the gate electrode 6503 with the gate insulating film 6504 interposed between them. The semiconductor film 6505 includes two impurity regions 6506a and 6506b which are added impurities that impart conductivities and function as a source or a drain. The impurity region 6506a is connected to a wiring 6508.

The driving transistor 6502 includes a gate electrode 6510 formed on a substrate 6500 having an insulating surface, a gate insulating film 6504 formed on the substrate 6500 so as to cover the gate electrode 6510, and a semiconductor film 6511 formed so as to overlap the gate electrode 6510 with the gate insulating film 6504 interposed between them. The semiconductor film 6511 includes two impurity regions 6512a and 6512b which are added impurities that impart conductivities and function as a source or a drain. The impurity region 6512a is connected to an impurity region 6506b of the driving transistor 6501 through a wiring 6513.

The driving transistor 6501 and the current controlling transistor 6502 are both covered with a protection film 6507 formed by an insulating film. The wiring 6508 is connected to an anode 6509 through a contact hole formed in the protection film 6507. The driving transistor 6501, the current controlling transistor 6502, and the protection film 6507 are covered with an interlayer insulating film 6520. The interlayer insulating film 6520 has an opening portion at which the anode 6509 is exposed. A electroluminescent layer 6521 and a cathode 6522 are formed on the anode 6509.

The driving transistor and the current controlling transistor are both n-type transistors in FIG. 14, however, they may be p-type transistors as well. In that case, an impurity which imparts p-type conductivity is used for controlling a threshold voltage of the driving transistor. Note that a blocking transistor may be provided between the driving transistor 6501 and the anode 6509, between the driving transistor 6501 and the current controlling transistor 6502, or at a place where a potential of the source of the current controlling transistor 6502 can be controlled. Further, the drain of the driving transistor 6501 is connected to the anode 6509 as an example, however, the drain of the current controlling transistor 6502 may be connected to the anode 6509 as well.

[Embodiment6]

Figure 15:
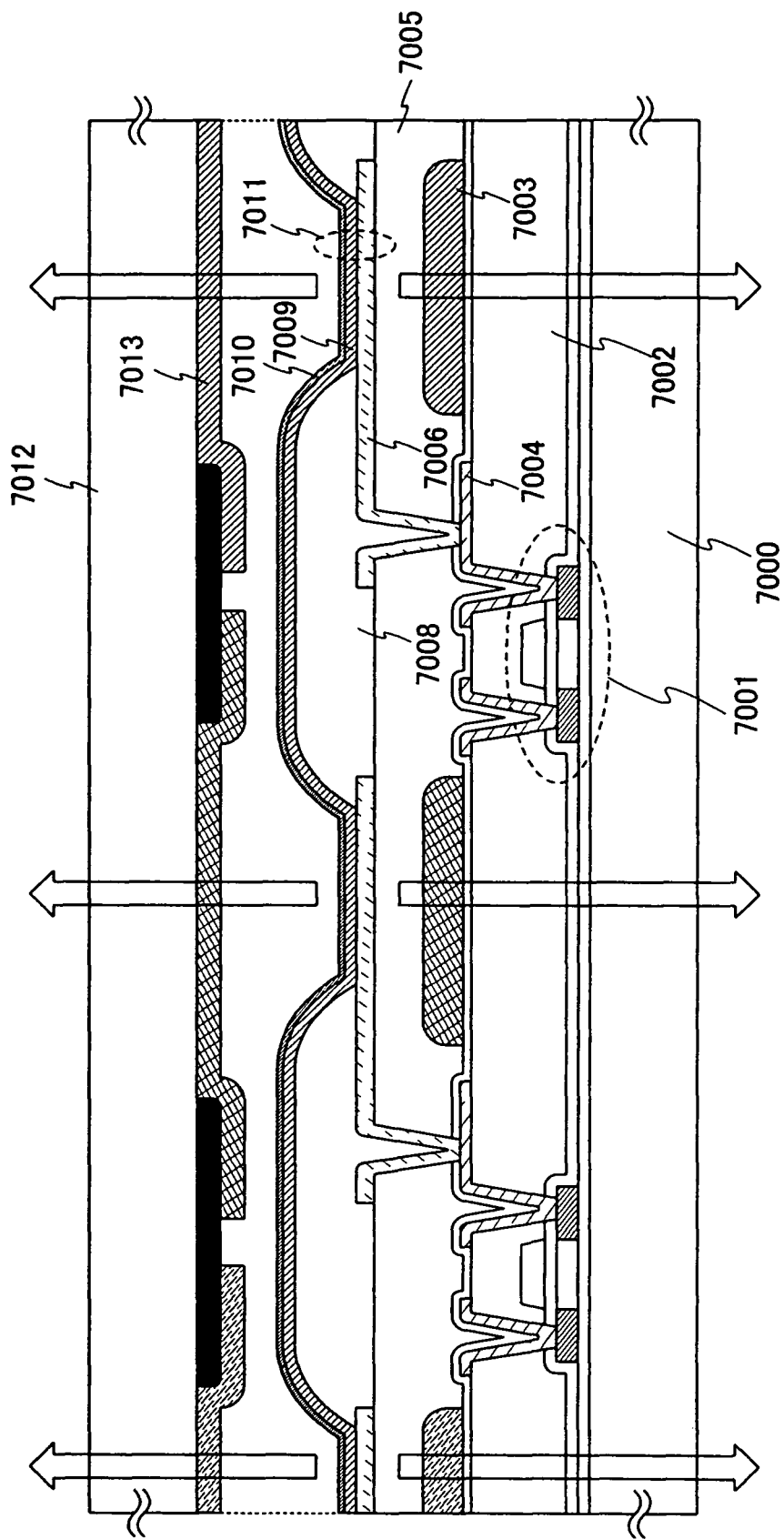
FIG. 15 shows a cross sectional structure of a pixel of the light emitting device of the invention as an example.

A cross sectional structure of a pixel in the light emitting device of the invention is described with reference to FIG. 15. FIG. 15 shows a transistor 7001 formed on a substrate 7000. It should be noted that the transistor 7001 is assumed to be a driving transistor in this embodiment, however, it may be a current controlling transistor or a blocking transistor. The driving transistor 7001 is covered with a first interlayer insulating film 7002. On the first interlayer insulating film 7002 is formed a color filter 7003 formed by resin and the like and a wiring 7004 which is electrically connected to the driving transistor 7001 through contact holes are formed. A current controlling transistor may be provided between the driving transistor 7001 and the wiring 7004.

A second interlayer insulating film 7005 is formed over the first interlayer insulating film 7002 so as to cover the color filter 7003 and the wiring 7004. It should be noted that the first interlayer insulating film 7002 and the second interlayer insulating film 7005 can be a single layer or a lamination of a silicon oxide, silicon nitride or a silicon oxynitride film formed by plasma CVD or sputtering. Further, lamination of a silicon oxynitride film which has higher mol rate of oxygen than nitrogen may be used as the fist interlayer insulating film 7002 or the second interlayer insulating film 7005 on a silicon oxynitride film which has higher mol rate of nitrogen than oxygen. Alternatively, an organic resin film or an organic polysiloxane film may be used as the first interlayer insulating film 7002 or the second interlayer insulating film 7005.

Formed on the second interlayer insulating film 7005 is a wiring 7006 which is electrically connected to the wiring 7004 through a contact hole. A portion of the wiring 7006 functions as an anode of the light emitting element. The wiring 7006 is formed so as to overlap the color filter 7003 with the second interlayer insulating film 7005 interposed between them.

A bank 7008 is formed by using an organic resin film, an inorganic insulating film or an organic polysiloxane film over the second interlayer insulating film 7005. The bank 7008 has an opening portion at which an electroluminescent layer 7009, a cathode 7010 and the wiring 7006 which functions as an anode are overlapped with each other to form a light emitting element 7011. The electroluminescent layer 7009 has a structure that a single light emitting layer or a plurality of layers including a light emitting layer are laminated. It should be noted that a protection film may be formed over the bank 7008 and the cathode 7010. In that case, the protection film that allows less substance such as moisture or oxygen to penetrate that causes a deterioration of a light emitting element than other insulating films is used. Typically, a DLC (diamond like carbon) film, a carbon nitride film, a silicon nitride film formed by RF sputtering or the like may preferably used. As the protection layer, it is also possible to use a lamination of a layer which allows less substance such as moisture, oxygen and the like to penetrate and a layer which allows moisture, oxygen and the like to penetrate with ease.

The bank 7008 is preferably heated in a vacuum atmosphere in order to remove absorbed moisture, oxygen and the like before forming the electroluminescent layer 7009. Specifically, heat treatment is applied in a vacuum atmosphere at a temperature ranging from 100 to 200° C. and for approximately 0.5 to 1 hour. The vacuum is desirably set at $3 \times 10^{-7}$ Torr or less, and if possible at $3 \times 10^{-8}$ Torr or less is the most desirable. In the case where the electroluminescent layer 7009 is formed after applying the heat treatment to the bank 7008 in the vacuum atmosphere, the reliability can be further enhanced by maintaining the electroluminescent layer 7009 in the vacuum atmosphere until immediately before the deposition.

An end portion of the bank 7008 at the opening portion are preferably allowed to have a round shape so that the electroluminescent layer 7009 formed partially overlapped with the bank 7008 does not have holes in the end portion thereof. Specifically, the curvature radius of the curve line shown by the sectional surface of the bank 7008 at the opening portion is preferably from 0.2 to 2 μm.

With the aforementioned structure, the coverage of the electroluminescent layer 7009 and the cathode 7010 can be enhanced. Thus, it can be prevented that the wiring 7006 and the cathode 7010 are short out at a hole formed in the electroluminescent layer 7009. Moreover, by relaxing the stress of each of the electroluminescent layer 7009, defect referred to as shrink that a light emitting region decreases can be reduced and the reliability can be thus enhanced.

In FIG. 15, an example using a positive photosensitive acrylic resin as the bank 7008 is shown. As for the photosensitive organic resin, there are a positive type in which a portion exposed with an energy beam such as light, electrons, and ions is removed, and a negative type where an exposed portion remains. In the invention, the negative type organic resin film may be used. When forming the bank 7008 by using the negative type acryl, an end portion thereof at the opening portion has a sigmoidal cross sectional shape. At this time, the curvature radius at a top and bottom part of the opening portion is preferably from 0.2 to 2 μm.

The wiring 7006 may be formed by using a light transmitting conductive film such as ITO, ITSO, IZO in which zinc oxide (ZnO) is mixed with indium oxide in the concentration of 2 to 20%. In FIG. 15, ITO is used as the wiring 7006. The wiring 7006 may be rubbed by CMP and cleaned by a swab using a polyvinyl alcohol porous body to be flat. After rubbing it by CMP, irradiation of UV rays, oxygen plasma processing and the like may be performed to the surface of the wiring 7006.

The cathode 7010 can be formed by using a known material as long as it is a conductive film having a small work function and being thin enough to transmit light. For example, Ca, Al, CaF, MgAg, AlLi and the like are desirable. In order to emit light to the cathode side, ITO of which work function is made small by adding Li can be used as well as making the film thickness thin. The light emitting element used in the invention may have a structure that the light can be emitted to both anode and cathode sides.

It is preferable that the light emitting device is packaged with a protection film (laminated film, ultraviolet ray cure resin film or the like) that is highly airtight and degasses little or a light transmitting covering material 7012 so as not to be exposed to the outside air. At that time, the reliability of the light emitting element is enhanced when the inside of the covering material is filled with an inert atmosphere or a moisture absorbent material (e.g., barium oxide) is disposed inside. In the invention, a color filter 7013 may be provided with the covering material 7012.

It should be noted that the invention is not limited to the aforementioned fabrication method, but can be fabricated by a known method as well.

Figure 16:
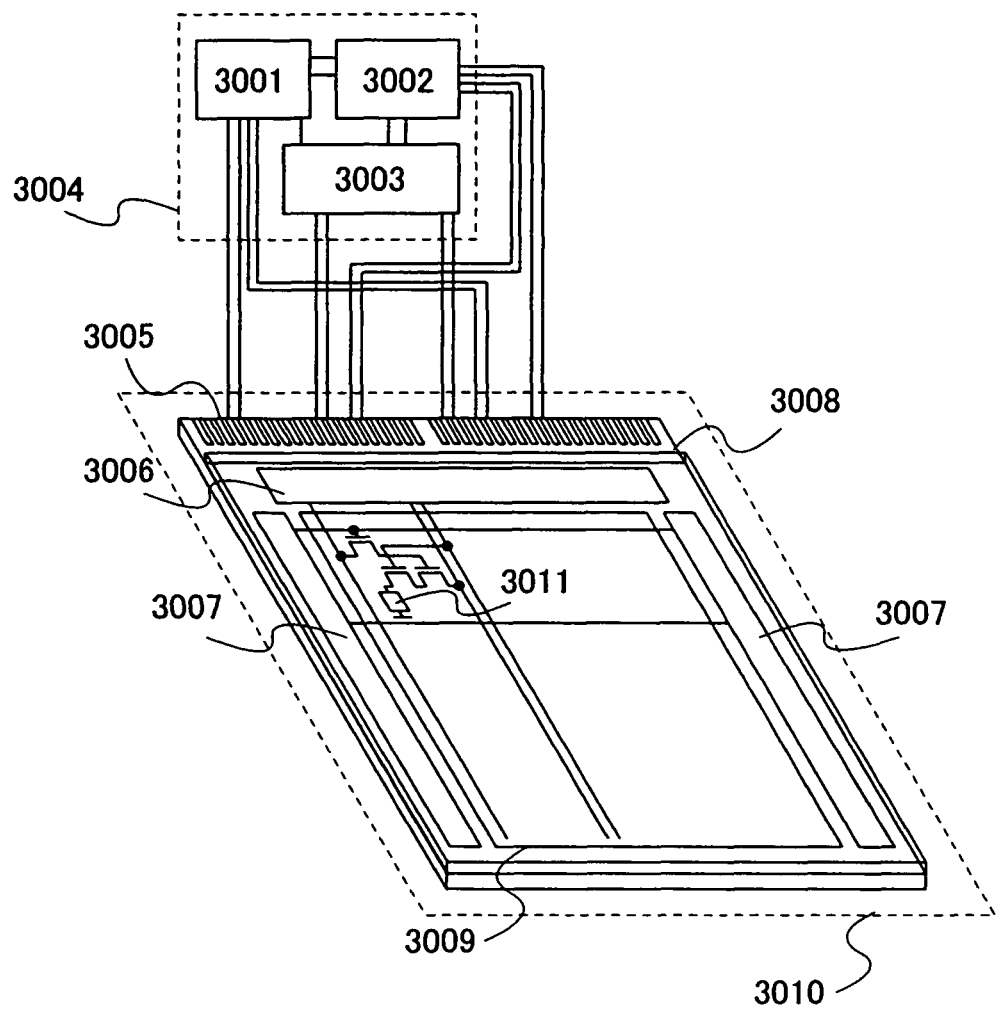
FIG. 16 shows a structure of an external circuit and a panel.

In this embodiment, a structure and a driving method of the light emitting device of the invention are described. FIG. 16 shows a block diagram of an external circuit in IC and a schematic diagram of the panel.

[Embodiment 7]

As shown in FIG. 16, a module corresponding to one mode of the light emitting device of the invention includes an external circuit 3004 and a panel 3010. The external circuit 3004 includes an A/D converting portion 3001, a power supply portion 3002 and a signal generating portion 3003. The A/D converting portion 3001 converts a video data signal inputted as an analog signal to a digital signal (video signal) and supplies it to a signal line driver circuit 3006. The power supply portion 3002 generates some desired levels of potentials from a potential supplied from a power supply such as a battery and an outlet and supplies each of them to the signal line driver circuit 3006, a scan line driver circuit 3007, a light emitting element 3011, the signal generating portion 3003 and the like. A potential of the power supply, a video signal, a synchronization signal and the like are inputted to the signal generating portion 3003. The signal generating portion 3003 converts various kinds of signals and generates a clock signal and the like for driving the signal line driver circuit 3006 and the scan line driver circuit 3007.

A signal and power supply from the external circuit 3004 are inputted to an internal circuits and the like in the panel 3010 from an FPC connecting portion 3005 in the panel 3010 through an FPC.

Further, in the panel 3010, an FPC connecting portion 3005 and internal circuits are formed on a substrate 3008. The internal circuits include the signal line driver circuit 3006, the scan line driver circuit 3007, a pixel portion 3009 and the like. The pixel portion 3009 includes the light emitting element 3011. FIG. 16 employs a pixel shown in Embodiment Mode 1 as an example, however, the pixel portion 3009 can employ any of the pixel configurations described in the embodiment modes of the invention.

Figure 17:
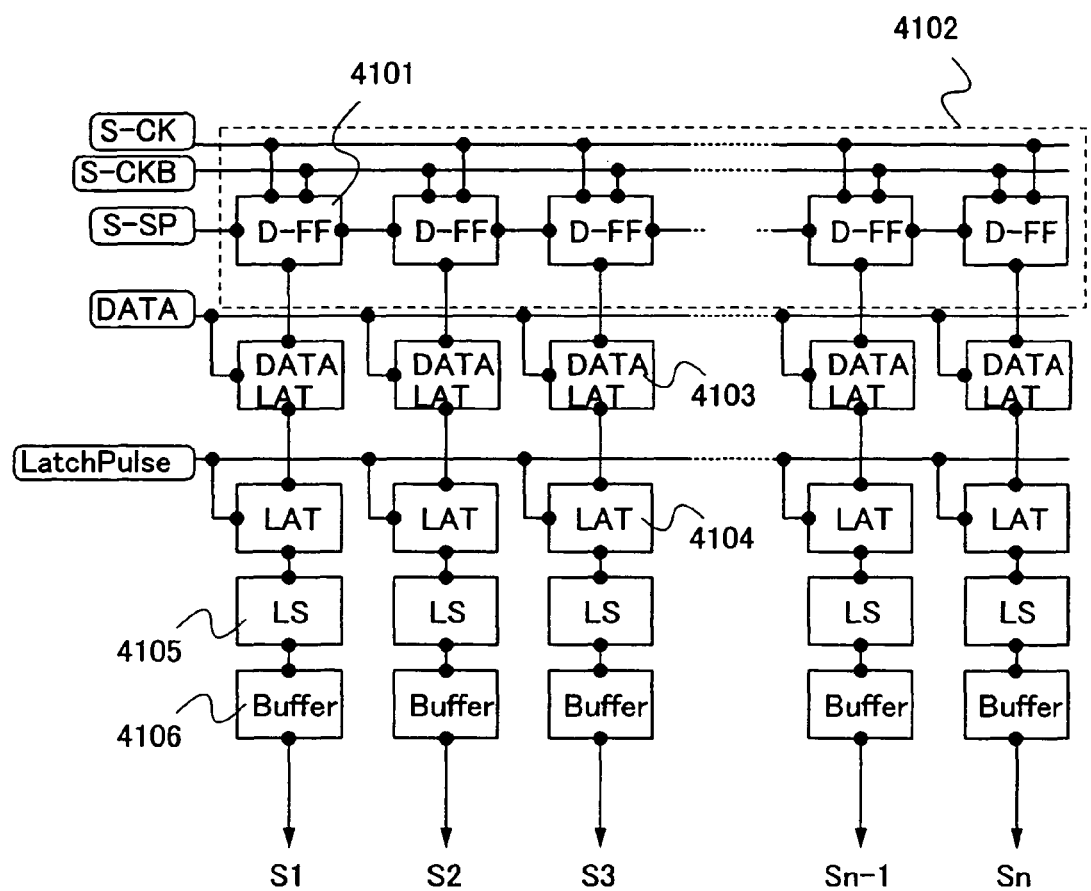
FIG. 17 shows one mode of a signal line driver circuit.

FIG. 17 shows a block diagram of a configuration of the signal line driver circuit 3006.

The signal line driver circuit 3006 includes a shift register 4102 having a plurality of stages of D-flip-flops 4101, a data latch circuit 4103, a latch circuit 4104, a level shifter 4105, a buffer 4106 and the like. Signals that are inputted are a clock signal (S-CK), an inverted clock signal (S-CKB), a start pulse (S-SP), a video signal (DATA), and a latch pulse (Latch Pulse).

First, sampling pulses are sequentially outputted from the shift register 4102 according to the timing of the clock signal (S-CK), inverted clock signal (S-CKB) and start pulse (S.-SP). The sampling pulse is inputted to the data latch circuit 4103 and the video signal is sampled and held accordingly. This operation is performed from the first column sequentially. After holding a video signal in the last stage of the data latch circuit 4103, a latch pulse is inputted in a horizontal retrace period. The video signals held in the data latch circuit 4103 are transferred to the latch circuit 4104 all at once. After that, the video signal is shifted in level in the level shifter 4105 and shaped in a buffer 4106, then outputted to the signal lines S1 to Sn all at once. At that time, H-level and L-level video signals are inputted from the scan line driver circuit 3007 to the pixels of the selected row to control light emission and non-light emission of the light emitting element 3011.

In the light emitting device shown in this embodiment, the external circuit 3004 is independent from the panel 3010, however, they may be formed integrally on the same substrate. Also, the level shifter 4105 and the buffer 4106 may not necessarily be provided in the signal line driver circuit 3006.

This embodiment can be implemented in combination with Embodiments 1 to 6.

[Embodiment 8]

Figure 18A:
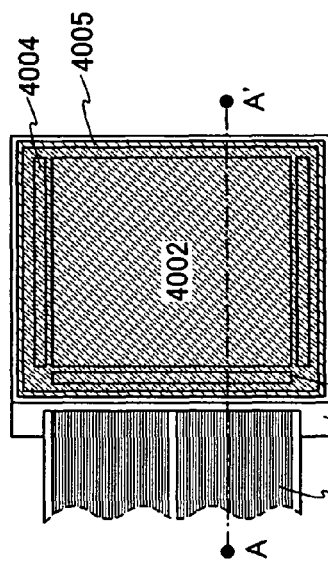
FIGS. 18A and 18B are top plan view and a cross sectional view of the light emitting device of the invention.
Figure 18B:
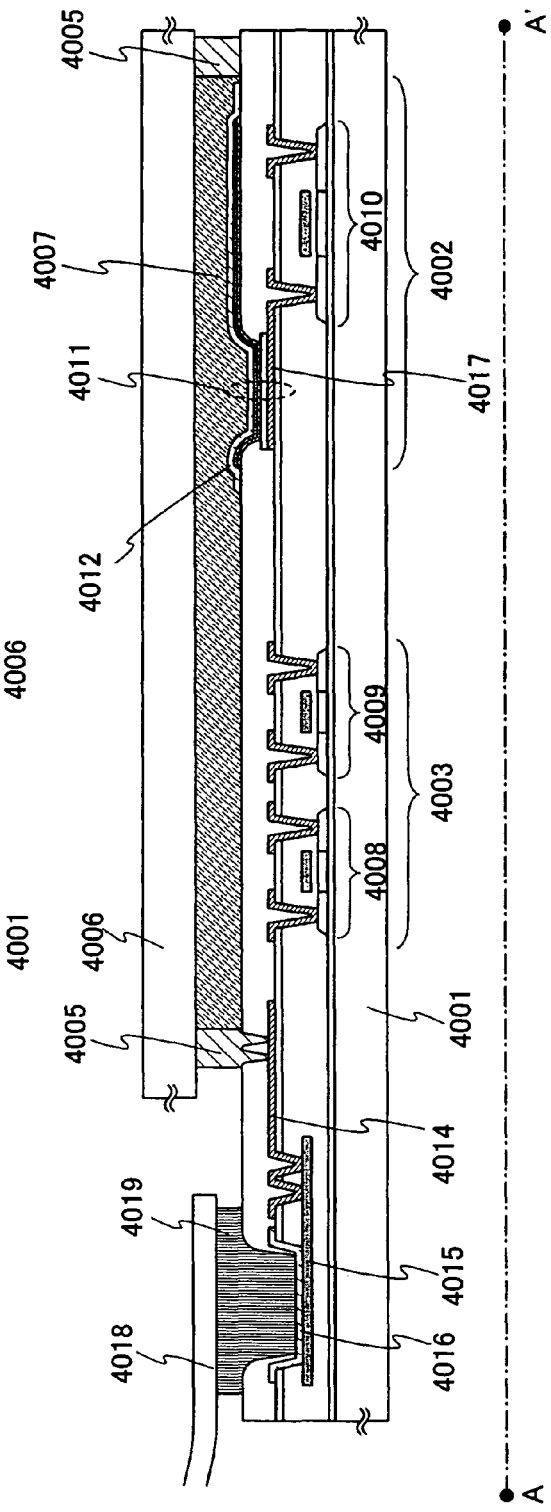

In this embodiment mode, an external view of a panel corresponding to one mode of the light emitting device of the invention is described with reference to FIGS. 18A and 18B. FIG. 18A is a top plan view of a panel in which a transistor and a light emitting element that are formed on a first substrate are sealed between the first substrate and a second substrate with a sealant. FIG. 18B is a cross sectional view of FIG. 18A along a line A-A'.

A sealant 4005 is provided so as to surround a pixel portion 4002, a signal line driver circuit 4003, and a scan line driver circuit 4004 which are provided on a first substrate 4001. A second substrate 4006 is provided on the pixel portion 4002, the signal line driver circuit 4003, and the scan line driver circuit 4004. Therefore, the pixel portion 4002, the signal line driver circuit 4003, and the scan line driver circuit 4004 are sealed with filler material between the first substrate 4001, the sealing members 4005 and the second substrate 4006 using the sealant 4005.

The pixel portion 4002, the signal line driver circuit 4003, and the scan line driver circuit 4004 which are provided on the first substrate 4001 include a plurality of transistors. FIG. 18B shows transistors 4008 and 4009 included in the signal line driver circuit 4003 and a transistor 4010 included in the pixel portion 4002 as an example. Note that the transistor 4010 is assumed to be a driving transistor in this embodiment, however, it may be a current controlling transistor or a blocking transistor.

A reference numeral 4011 denotes a light emitting element of which pixel electrode is electrically connected to the drain of the driving transistor 4010 through a wiring 4017. A counter electrode of the light emitting element 4011 and a light transmitting conductive film 4012 are electrically connected in this embodiment. It should be noted that a structure of the light emitting element 4011 is not limited to the one shown in this embodiment, but can be changed appropriately according to the direction of light emission from the light emitting element 4011 and a conductivity of the driving transistor 4010.

A variety of signals and potentials to supplied to the signal line driver circuit 4003, the scan line driver circuit 4004, and the pixel portion 4002 are not shown in the cross sectional view in FIG. 18B, however, they are supplied from a connecting terminal 4016 through lead wirings 4014 and 4015.

In this embodiment, the connecting terminal 4016 is formed by the same conductive film as the pixel electrode of the light emitting element 4011. Further, the lead wiring 4014 is formed by the same conductive film as the wiring 4017. The lead wiring 4015 is formed by the same conductive film as each gate electrode of the driving transistor 4010 and the transistors 4008 and 4009.

The connecting terminal 4016 is electrically connected to a terminal of an FPC 4018 through an anisotropic conductive film 4019.

Note that the first substrate 4001 and the second substrate 4006 may be formed by glass, metal (typically, stainless metal), ceramic, or plastic. Examples of the plastic are an FRP (Fiberglass-Reinforced Plastics) plate, a PVF (Polyvinyl fluoride) film, a Mylar film, a polyester film or an acryl resin film. Further, an aluminum foil sandwiched with a PVF film or a Mylar film can be used as well.

However, the second substrate which is provided in the direction of the light emission from the light emitting element 4011 has to transmit light. In that case, the second substrate is formed by a light transmitting material such as a glass plate, a plastic plate, a polyester film or an acryl film.

As the filler material 4007, an ultraviolet ray cure resin or heat cure resin can be used as well as an inert gas such as nitrogen and argon. PVC (Polyvinyl Chloride), acryl, polyimide, epoxy resin, silicon resin, PVB (Polyvinyl Butyral), or EVA (Ethylene Vinyl Acetate) can be used as well. Nitrogen is used as the filler material in this embodiment.

A moisture or oxygen absorbent material (e.g., barium oxide) may be provided in the filler material 4007 in order to suppress the degradation of the light emitting element 4011.

This embodiment can be implemented in combination with Embodiments 1 to 7.

[Embodiment 9]

The light emitting device having a light emitting element emits light by itself, therefore, it is superior to a liquid crystal display in visibility in light and viewing angle. Thus, it can be used in a display portion of a variety of electronic devices.

Electronic devices using the light emitting device of the invention include a video camera, a digital camera, a goggle type display (head mounted display), a navigation system, an audio reproducing device (a car audio, an audio component system and the like), a notebook style personal computer, a game machine, a portable information terminal (a mobile computer, a portable phone, a portable game machine, an electronic book and the like), and an image reproducing device mounted with a recording medium (specifically, a device mounted with a display device which can reproduce a recording medium such as a digital versatile disk (DVD), and can display the image). Specific examples of the electric appliance are shown in FIGS. 19A to 19E.

Figure 19A:
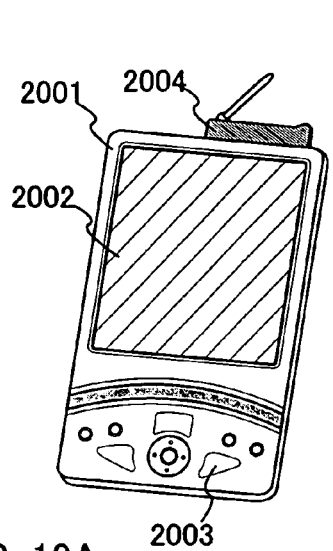
FIGS. 19A to 19E illustrate electronic devices using the light emitting device of the invention.

FIG. 19A illustrates a portable information terminal including a body 2001, a display portion 2002, an operating key 2003, a modem 2004 and the like. FIG. 19A shows a portable information terminal of which modem 2004 is removable, however, the body 2001 of the portable information terminal may have the modem 2004 built-in. The light emitting device of the invention can be used in the display portion 2002.

Figure 19B:
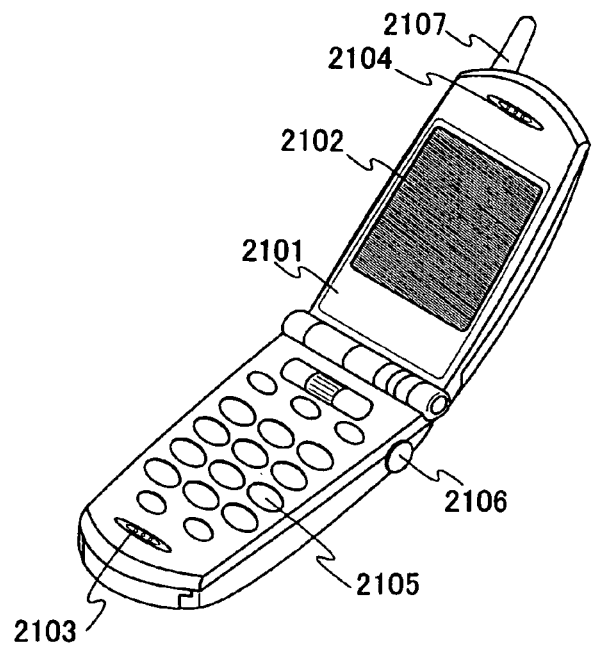

FIG. 19B illustrates a portable phone including a body 2101, a display portion 2102, an audio input portion 2103, an audio output portion 2104, an operating key 2105, an external connecting port 2106, an antenna 2107 and the like. Note that the power consumption of the portable phone can be suppressed by displaying white text on a black background on the display portion 2102. The light emitting device of the invention can be used in the display portion 2102.

Figure 19C:
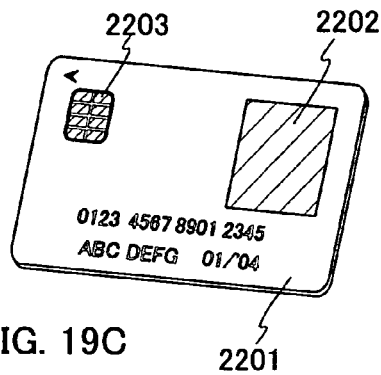

FIG. 19C illustrates an electronic card including a body 2201, a display portion 2202, a connecting terminal 2203 and the like. The light emitting device of the invention can be used in the display portion 2202. It should be noted that FIG. 19C illustrates a contact type electronic card, however, the light emitting device of the invention can be used in an non-contact type electronic card or an electronic card operating both with and without contact.

Figure 19D:
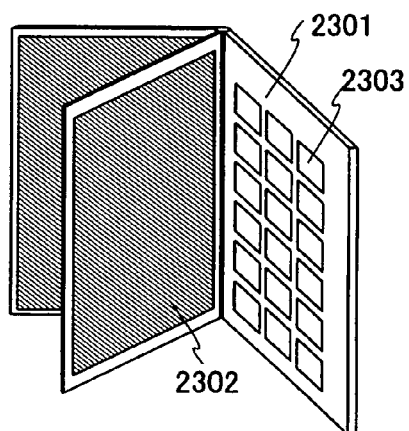

FIG. 19D illustrates an electronic data book including a body 2301, a display portion 2302, an operating key 2303 and the like. The body 2301 may have a modem built-in. The display portion 2302 is used in the light emitting device of the invention.

Figure 19E:
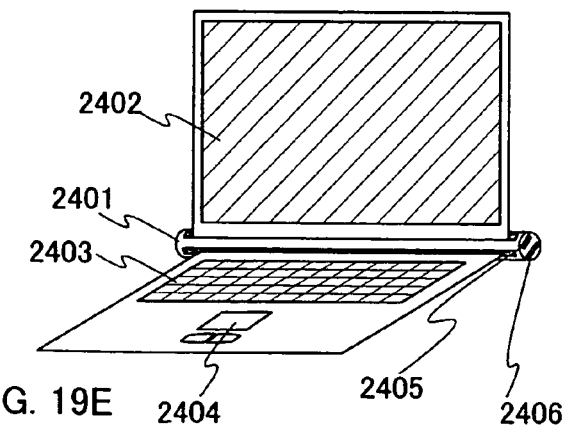

FIG. 19E illustrates a sheet form personal computer including a body 2401, a display portion 2402, a keyboard 2403, a touch pad 2404, an external connecting port 2405, a power supply plug 2406 and the like. The display device of the invention is used in the display portion 2402.

As described above, the application range of the invention is quite wide, and the invention can be used in a variety of fields of electronic devices. Further, the electronic devices described in this embodiment can employ the light emitting device of any configuration described in Embodiments 1 to 8.

This application is based on Japanese Patent Application serial no. 2003-188746 filed in Japan Patent Office on Jun. 30, 2003, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A driving method of a light emitting device comprising a pixel comprising a first transistor, a second transistor, a third transistor and a light emitting element, wherein the light emitting element comprises a pixel electrode, a counter electrode, and an electroluminescent layer formed between the pixel electrode and the counter electrode, wherein the second transistor and the third transistor are electrically connected in series between a first power supply line and the pixel electrode, wherein a gate electrode of the first transistor is electrically connected to a scan line, wherein a gate electrode of the second transistor is electrically connected to a second power supply line having a second potential, and wherein a gate electrode of the third transistor is electrically connected to one of a source electrode and a drain electrode of the first transistor, the driving method comprising:

applying a first potential to the gate electrode of the third transistor by turning ON the first transistor by selecting the scan line, wherein the second transistor is ON when the first transistor is ON;

making the counter electrode into a floating state while the first potential is applied to the gate electrode of the third transistor;

turning OFF the first transistor; and applying a third potential to the counter electrode so that a current flows in the light emitting element, wherein the first transistor operates in a linear region, wherein the second transistor operates in a saturation region, wherein the third transistor operates in a linear region, wherein the second potential is a fixed potential, wherein an amount of the current is controlled by the second transistor, and wherein the current does not flow in the light emitting element while the first transistor and the second transistor are ON.

2. The driving method of a light emitting device according to claim 1, wherein the light emitting device further comprises a fourth transistor between the second transistor and the third transistor.

3. The driving method of a light emitting device according to claim 1, wherein the current supplied to the light emitting element is a constant current.

4. A driving method of a light emitting device comprising a first transistor, a second transistor, a third transistor and a light emitting element, wherein the light emitting element comprises a pixel electrode, a counter electrode, and an electroluminescent layer formed between the pixel electrode and the counter electrode, wherein the second transistor and the third transistor are electrically connected in series between a first power supply line and the pixel electrode, wherein a gate electrode of the third transistor is electrically connected to one of a source electrode and a drain electrode of the first transistor, and wherein a gate electrode of the second transistor is electrically connected to a second power supply line, the driving method comprising:

applying a first potential to the gate electrode of the third transistor by turning ON the first transistor;

applying a third potential of the first power supply line to the counter electrode while the first potential is applied to the gate electrode of the third transistor;

turning OFF the first transistor; and applying a fourth potential to the counter electrode so that a current flows in the light emitting element, wherein the first transistor operates in a linear region, wherein the second transistor operates in a saturation region, wherein the third transistor operates in a linear region, wherein a second potential of the second power supply line is fixed, wherein an amount of the current is controlled by the second transistor, and wherein the current does not flow in the light emitting element while the first transistor and the second transistor are ON.

5. The driving method of a light emitting device according to claim 4, wherein the first transistor operates in a linear region.

6. The driving method of a light emitting device according to claim 4, wherein the light emitting device further comprises a fourth transistor between the second transistor and the third transistor.

7. The driving method of a light emitting device according to claim 4, wherein the third potential of the first power supply line is a constant potential.

8. A driving method of a light emitting device comprising a pixel comprising a first transistor, a second transistor, a third transistor and a light emitting element, wherein the light emitting element comprises a pixel electrode, a counter electrode, and an electroluminescent layer formed between the pixel electrode and the counter electrode, wherein the second transistor and the third transistor are electrically connected in series between a first power supply line and the pixel electrode, wherein a gate electrode of the first transistor is electrically connected to a scan line, wherein a gate electrode of the second transistor is electrically connected to a second power supply line having a second potential, wherein a gate electrode of the third transistor is electrically connected to one of a source electrode and a drain electrode of the first transistor, and wherein the scan line crosses the second power supply line, the driving method comprising:

applying a first potential to the gate electrode of the third transistor by turning ON the first transistor by selecting the scan line, wherein the second transistor is ON when the first transistor is ON;

making the counter electrode into a floating state while the first potential is applied to the gate electrode of the third transistor;

turning OFF the first transistor; and applying a third potential to the counter electrode so that a current flows in the light emitting element, wherein the first transistor operates in a linear region, wherein the second transistor operates in a saturation region, wherein the third transistor operates in a linear region, wherein the second potential is a fixed potential, wherein an amount of the current is controlled by the second transistor, and wherein the current does not flow in the light emitting element while the first transistor and the second transistor are ON.

9. The driving method of a light emitting device according to claim 8, wherein the current supplied to the light emitting element is a constant current.

10. A driving method of a light emitting device comprising a pixel comprising a first transistor, a second transistor, a third transistor, and a light emitting element, wherein the light emitting element comprises a pixel electrode, a counter electrode, and an electroluminescent layer formed between the pixel electrode and the counter electrode, wherein the second transistor and the third transistor are electrically connected in series between a first power supply line and the pixel electrode, wherein a gate electrode of the first transistor is electrically connected to a scan line, wherein a gate electrode of the second transistor is electrically connected to a second power supply line, and wherein a gate electrode of the third transistor is electrically connected to one of a source electrode and a drain electrode of the first transistor, the driving method comprising:

applying a first potential to the gate electrode of the third transistor by turning ON the first transistor by selecting the scan line, wherein the second transistor is ON while the first transistor is ON;

making the counter electrode into a floating state while the first potential is applied to the gate electrode of the third transistor;

turning OFF the first transistor; and applying a third potential to the counter electrode so that a current flows in the light emitting element, wherein the second power supply line is configured to be supplied with a second potential which is a fixed potential, wherein the current does not flow in the light emitting element while the first transistor and the second transistor are ON, wherein the first transistor operates in a linear region, wherein the second transistor operates in a saturation region, and wherein the third transistor operates in a linear region.

* * * * *

UNITED STATES PATENT AND TRADEMARK OFFICE
CERTIFICATE OF CORRECTION

| | | |
|---|---|---|
| PATENT NO. | : 8,552,933 B2 | Page 1 of 1 |
| APPLICATION NO. | : 10/876714 | |
| DATED | : October 8, 2013 | |
| INVENTOR(S) | : Koyama et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1578 days.

Signed and Sealed this
Third Day of March, 2015

Michelle K. Lee
*Deputy Director of the United States Patent and Trademark Office*